United States Patent
Sasa et al.

(10) Patent No.: US 10,518,199 B2
(45) Date of Patent: Dec. 31, 2019

(54) TREATMENT SOLUTION SUPPLY APPARATUS

(71) Applicant: Tokyo Electron Limited, Tokyo (JP)

(72) Inventors: Takashi Sasa, Koshi (JP); Daisuke Ishimaru, Koshi (JP); Katsuya Hashimoto, Koshi (JP); Hideo Shite, Koshi (JP); Shinya Wakamizu, Koshi (JP); Kazuhiko Kimura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 15/696,365

(22) Filed: Sep. 6, 2017

(65) Prior Publication Data

US 2018/0065065 A1   Mar. 8, 2018

(30) Foreign Application Priority Data

Sep. 8, 2016  (JP) ................................. 2016-175234
Mar. 23, 2017 (JP) ................................. 2017-057117

(51) Int. Cl.
| | | |
|---|---|---|
| *B01D 29/60* | (2006.01) | |
| *G03F 7/16* | (2006.01) | |
| *B01D 37/04* | (2006.01) | |
| *B01D 35/02* | (2006.01) | |
| *G03F 7/30* | (2006.01) | |
| *F04B 43/08* | (2006.01) | |
| *F04B 43/02* | (2006.01) | |

(Continued)

(52) U.S. Cl.
CPC ........... *B01D 29/606* (2013.01); *B01D 35/02* (2013.01); *B01D 37/046* (2013.01); *F04B 43/02* (2013.01); *F04B 43/08* (2013.01); *F04B 53/10* (2013.01); *F04B 53/20* (2013.01); *G03F 7/16* (2013.01); *G03F 7/162* (2013.01); *G03F 7/3021* (2013.01); *B01D 2201/20* (2013.01); *B01D 2201/202* (2013.01)

(58) Field of Classification Search
CPC .......... B01D 2201/20; B01D 2201/202; B01D 29/606; B01D 35/02; B01D 37/046; F04B 43/02; F04B 43/08; F04B 53/10; F04B 53/20; G03F 7/16
See application file for complete search history.

(56) References Cited

U.S. PATENT DOCUMENTS

| | | | | |
|---|---|---|---|---|
| 6,056,998 | A  * | 5/2000 | Fujimoto | H01L 21/6715 |
| | | | | 427/240 |
| 9,731,226 | B2 * | 8/2017 | Yoshihara | B01D 19/0031 |
| 2010/0058985 | A1 * | 3/2010 | Kim | G03F 7/16 |
| | | | | 118/720 |

FOREIGN PATENT DOCUMENTS

JP    2013-211525 A    10/2013

* cited by examiner

*Primary Examiner* — Terry K Cecil
(74) *Attorney, Agent, or Firm* — Posz Law Group, PLC

(57) ABSTRACT

A treatment solution supply apparatus for supplying a treatment solution to a treatment solution discharge unit that discharges the treatment solution to a treatment body, includes: a temporary storage apparatus that temporarily stores the treatment solution supplied from a treatment solution supply source that stores the treatment solution; a filter that removes a foreign substance in the treatment solution from the temporary storage apparatus; and a pump that sends the treatment solution from which the foreign substance has been removed by the filter to the treatment solution discharge unit, wherein the temporary storage apparatus has a pressure-feeding function of pressure-feeding the treatment solution stored in the temporary storage apparatus.

11 Claims, 25 Drawing Sheets

(51) Int. Cl.
*F04B 53/10* (2006.01)
*F04B 53/20* (2006.01)

TREATMENT SOLUTION SUPPLY APPARATUS

CROSS REFERENCE TO RELATED APPLICATIONS

This application is based upon and claims the benefit of priority of the prior Japanese Patent Application No. 2016-175234, filed in Japan on Sep. 8, 2016, and the prior Japanese Patent Application No. 2017-57117, filed in Japan on Mar. 23, 2017, the entire contents of which are incorporated herein by reference.

BACKGROUND OF THE INVENTION

1. Field of the Invention

The present invention relates to a treatment solution supply apparatus that supplies a treatment solution such as a resist solution to a treatment body via a treatment solution discharge unit.

2. Description of the Related Art

In a photolithography process in a manufacturing process of a semiconductor device or the like, a treatment solution such as a resist solution, a developing solution or the like is used for forming a coating film such as an anti-reflection film or a resist film on a treatment body such as a semiconductor wafer, or for developing the resist film after exposure. In this treatment solution, foreign substances (particles) are sometimes included. Besides, if no particle exists in the original treatment solution, particles may be mixed into the treatment solution to be supplied when particles adhere to a route of pumps, valves, and piping of an apparatus that supplies the treatment solution. For this reason, a filter is provided in the route of the apparatus that supplies the treatment solution, and the filter removes the particles (Japanese Laid-open Patent Publication No. 2013-211525).

Note that a treatment solution supply apparatus in Japanese Laid-open Patent Publication No. 2013-211525 is provided with a buffer tank that temporarily stores the treatment solution, between the resist solution supply source and the filter to prevent stop of the operation of the apparatus when the resist solution supply source storing the treatment solution is replaced.

As in the treatment solution supply apparatus in Japanese Laid-open Patent Publication No. 2013-211525, using the filter makes it possible to collect/remove the particles in the treatment solution, but the particle collection efficiency of the filter varies depending on the hydraulic pressure of the treatment solution at the time of passing through the filter.

However, the hydraulic pressure of the treatment solution at the time of passing through the filter is not a desired one due to the positional relation between the buffer tank and the filter, piping between them or the like in some cases. Further, also when the treatment solution supply apparatus is installed, for example, at highland, a desired hydraulic pressure of the treatment solution at the time of passing through the filter cannot be obtained in some cases.

SUMMARY OF THE INVENTION

The present invention has been made in consideration of the above point, and its object is to provide a treatment solution supply apparatus capable of appropriately removing particles in a treatment solution by a filter regardless of positional relation and piping between units in the apparatus, installation conditions or the like.

To achieve the above object, the present invention is a treatment solution supply apparatus for supplying a treatment solution to a treatment solution discharge unit that discharges the treatment solution to a treatment body, the treatment solution supply apparatus including: a temporary storage apparatus that temporarily stores the treatment solution supplied from a treatment solution supply source that stores the treatment solution; a filter that removes a foreign substance in the treatment solution from the temporary storage apparatus; and a pump that sends the treatment solution from which the foreign substance has been removed by the filter to the treatment solution discharge unit, wherein the temporary storage apparatus has a pressure-feeding function of pressure-feeding the treatment solution stored in the temporary storage apparatus.

According to the treatment solution supply apparatus of the present invention, it is possible to appropriately remove particles in a treatment solution by a filter regardless of positional relation and piping between units in the apparatus, installation conditions or the like.

DETAILED DESCRIPTION OF THE INVENTION

First Embodiment

Figure 1:
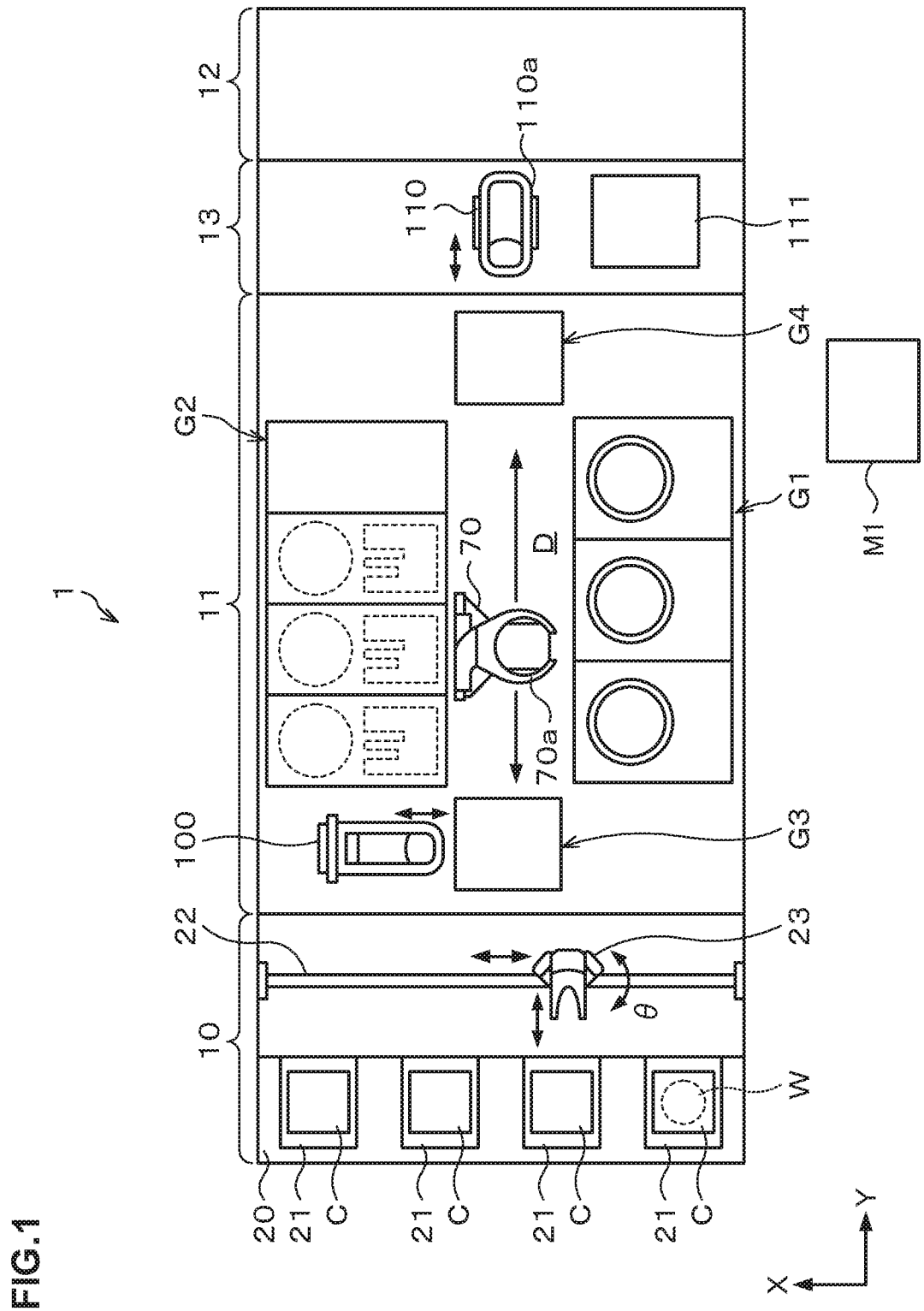
FIG. 1 is a plan view illustrating the outline of a configuration of a substrate treatment system according to an embodiment of the present invention.
Figure 2:
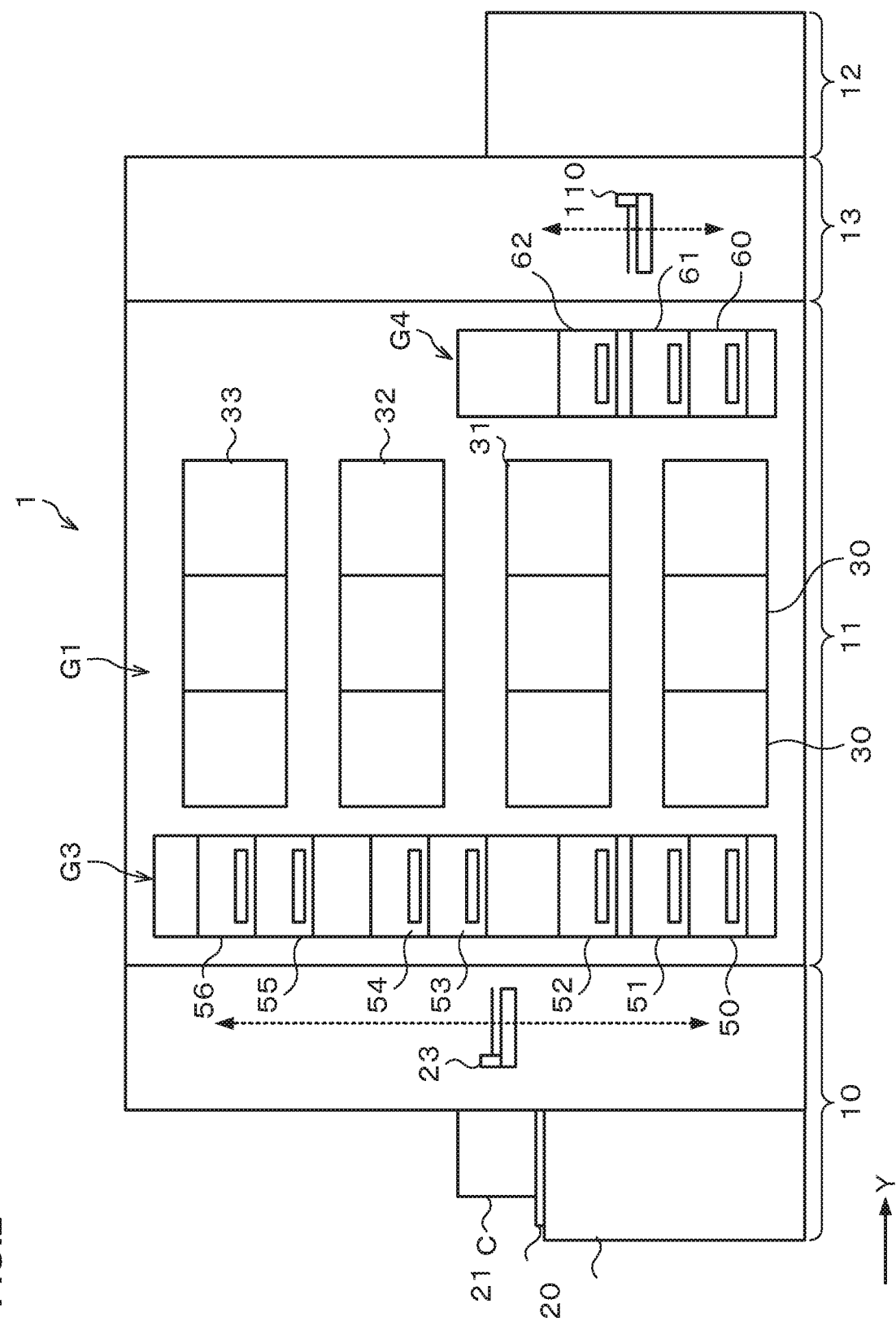
FIG. 2 is a front view illustrating the outline of the configuration of the substrate treatment system according to the embodiment of the present invention.
Figure 3:
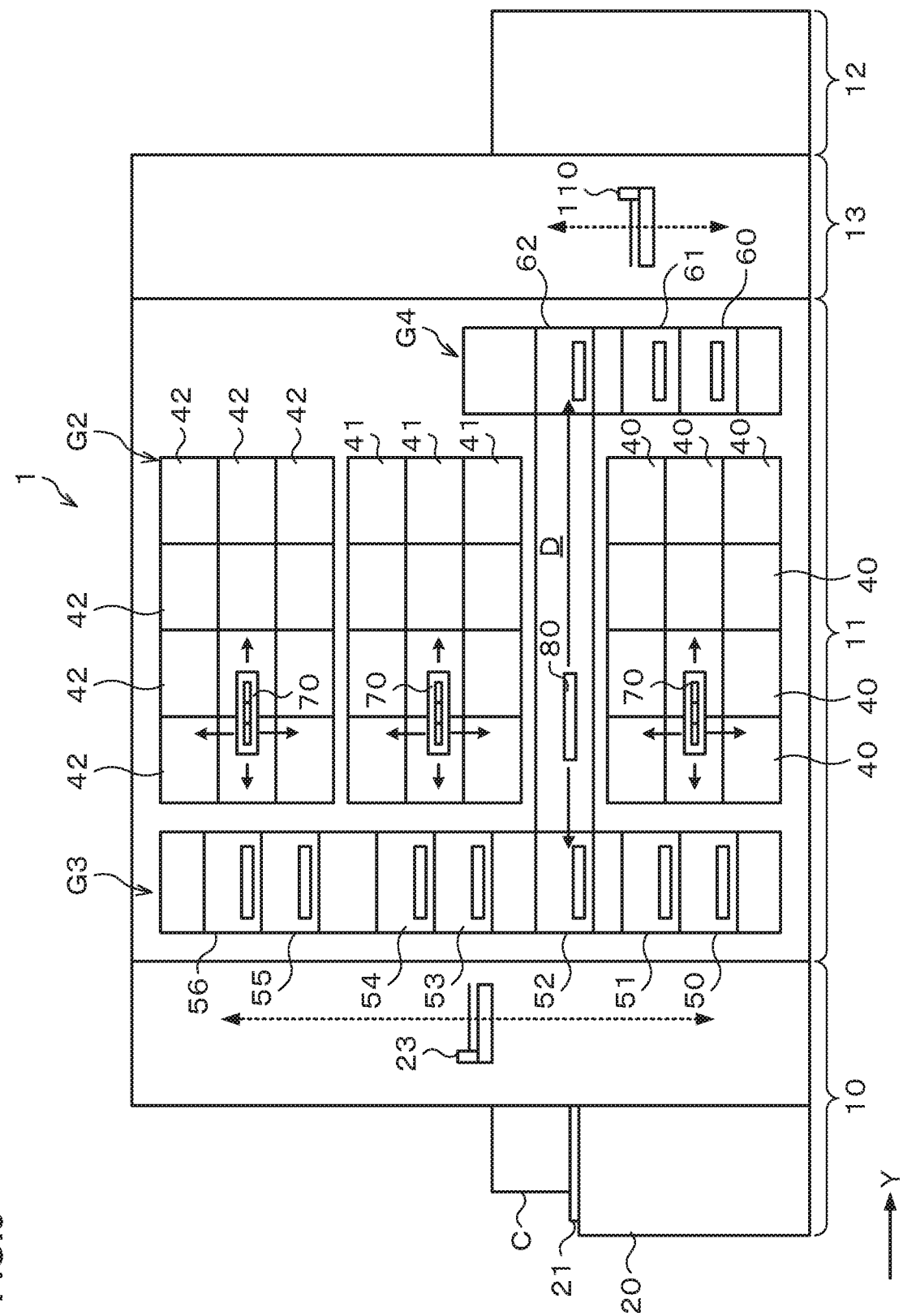
FIG. 3 is a rear view illustrating the outline of the configuration of the substrate treatment system according to the embodiment of the present invention.

Hereinafter, embodiments of the present invention will be described. FIG. 1 is an explanatory view illustrating the outline of a configuration of a substrate treatment system 1 equipped with a resist solution supply apparatus as a treatment solution supply apparatus according to a first embodiment of the present invention. FIG. 2 and FIG. 3 are a front view and a rear view schematically illustrating the outline of an internal configuration of the substrate treatment system 1, respectively. Note that in this specification and the drawings, components having substantially the same functional configurations are denoted by the same signs to omit duplicate description.

The substrate treatment system 1 has, as illustrated in FIG. 1, a configuration in which a cassette station 10 into/out of which a cassette C housing a plurality of wafers W is transferred, a treatment station 11 which includes a plurality of various treatment apparatuses performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in order from the bottom.

For example, three each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the treatment solution apparatuses such as the developing treatment apparatus 30, the lower anti-reflection film forming apparatus 31, the resist coating apparatus 32, and the upper anti-reflection film forming apparatus 33, for example, spin coating of applying a predetermined treatment solution onto the wafer W is performed. In the spin coating, the treatment solution is discharged, for example, from a coating nozzle onto the wafer W and the wafer W is rotated to diffuse the treatment solution over the front surface of the wafer W.

For example, in the second block G2, as illustrated in FIG. 3, thermal treatment apparatuses 40 each of which performs thermal treatments such as heating and cooling on the wafer W, adhesion apparatuses 41 each for enhancing adhesion between the resist solution and the wafer W, and edge exposure apparatuses 42 each of which exposes the outer peripheral portion of the wafer W, are provided side by side in the vertical direction and in the horizontal direction. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm that is movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a that is movable, for example, in the Y-direction, the θ-direction, and the vertical direction. The wafer transfer apparatus 110 can transfer the wafer W to/from each of the delivery apparatuses in the fourth block G4, the delivery apparatus 111 and the exposure apparatus 12, for example, while supporting the wafer W by the transfer arm 110a.

Figure 4:
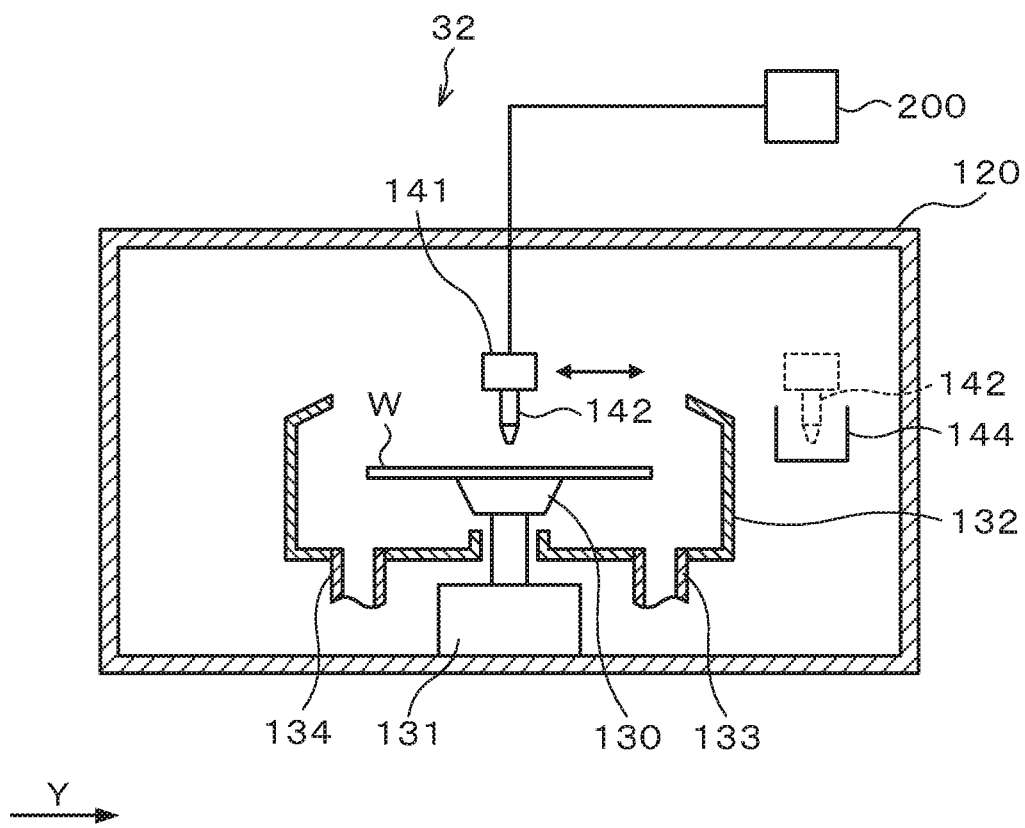
FIG. 4 is a longitudinal cross-sectional view illustrating the outline of a configuration of a resist coating apparatus.
Figure 5:
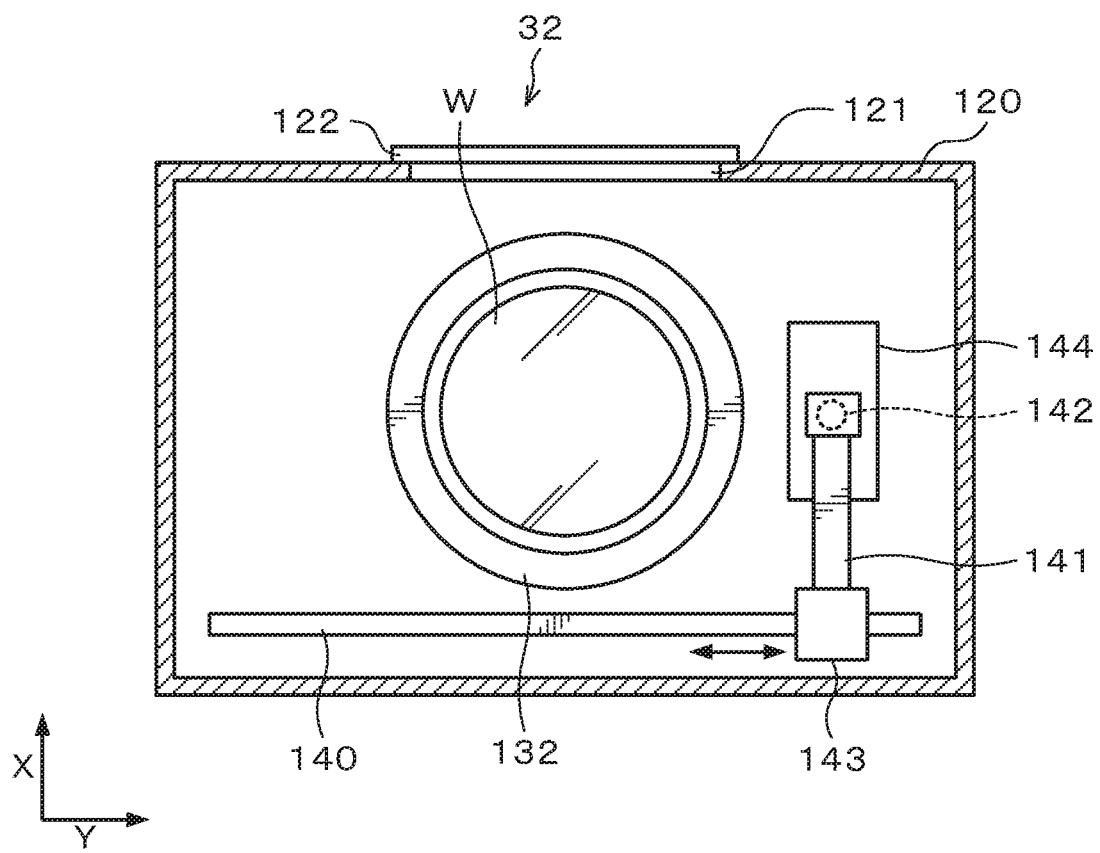
FIG. 5 is a transverse cross-sectional view illustrating the outline of the configuration of the resist coating apparatus.

Next, the configuration of the above-described resist coating apparatus 32 will be described. FIG. 4 is a longitudinal cross-sectional view illustrating the outline of a configuration of the resist coating apparatus 32. FIG. 5 is a transverse cross-sectional view illustrating the outline of the configuration of the resist coating apparatus 32.

The resist coating apparatus 32 has a treatment container 120 whose inside can be closed as illustrated in FIG. 4. A side surface of the treatment container 120 is provided with a transfer-in/out port 121 for the wafer W, and an open/close shutter 122 is provided at the transfer-in/out port 121 as illustrated in FIG. 5.

At the center portion in the treatment container 120, a spin chuck 130 is provided which holds and rotates the wafer W thereon as illustrated in FIG. 4. The spin chuck 130 has a horizontal upper surface, and the upper surface is provided with, for example, a suction port (not illustrated) for sucking the wafer W. By suction through the suction port, the wafer W can be suction-held on the spin chuck 130.

The spin chuck 130 has a chuck drive mechanism 131 equipped with, for example, a motor or the like and can rotate at a predetermined speed by the chuck drive mechanism 131. Further, the chuck drive mechanism 131 is provided with a raising and lowering drive source such as a cylinder so that the spin chuck 130 can freely move up and down.

Around the spin chuck 130, a cup 132 is provided which receives and collects liquid splashing or dropping from the wafer W. A drain pipe 133 that drains the collected liquid and an exhaust pipe 134 that exhausts the atmosphere in the cup 132 are connected to the lower surface of the cup 132.

As illustrated in FIG. 5, on an X-direction negative direction (lower direction in FIG. 5) side of the cup 132, a rail 140 is formed which extends along a Y-direction (right-left direction in FIG. 5). The rail 140 is formed, for example, from a Y-direction negative direction (left direction in FIG. 5) side outer position to a Y-direction positive direction (right direction in FIG. 5) side outer position of the cup 132. To the rail 140, an arm 141 is attached.

On the arm 141, a coating nozzle 142 which discharges the resist solution is supported as illustrated in FIG. 4 and FIG. 5. The arm 141 is movable on the rail 140 by means of a nozzle drive unit 143 illustrated in FIG. 5. This allows the coating nozzle 142 to move from a waiting section 144 set at the Y-direction positive direction side outer position of the cup 132 to a position above the center portion of the wafer W in the cup 132, and further move in a radius direction of the wafer W above the front surface of the wafer W. Further, the arm 141 freely rises and lowers by means of the nozzle drive unit 143 to be able to adjust the height of the coating nozzle 142. The coating nozzle 142 is connected to a resist solution supply apparatus 200 that supplies the resist solution as illustrated in FIG. 4.

Figure 6:
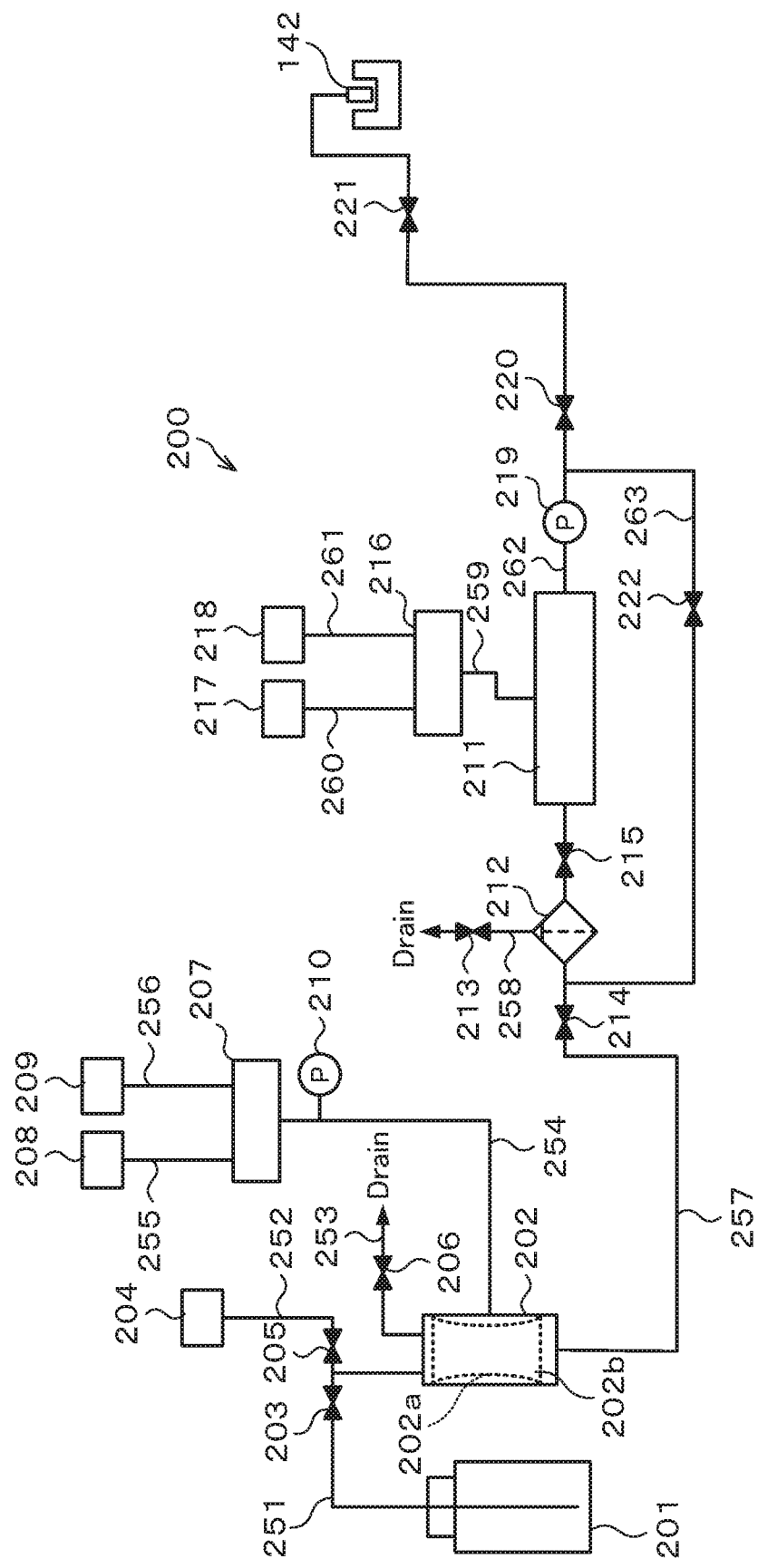
FIG. 6 is an explanatory view illustrating the outline of a configuration of a resist coating apparatus according to a first embodiment.
Figure 7A:
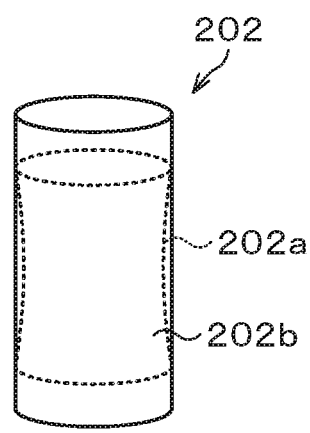
FIG. 7A and FIG. 7B are schematic external views explaining a buffer tank.
Figure 7B:
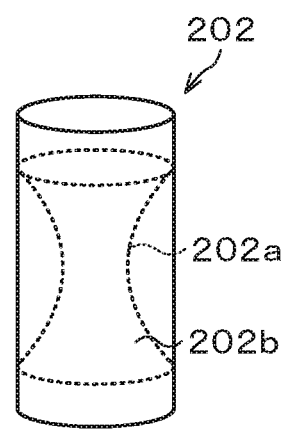

Next, a configuration of the resist solution supply apparatus 200 that supplies the resist solution to the coating nozzle 142 as a treatment solution discharge unit in the resist coating apparatus 32 will be described. FIG. 6 is an explanatory view illustrating the outline of the configuration of the resist solution supply apparatus 200. FIG. 7A and FIG. 7B are schematic external views explaining a buffer tank. Note that the resist solution supply apparatus 200 is provided, for example, in a not-illustrated chemical chamber. The chemical chamber is for supplying various treatment solutions to the solution treatment apparatuses.

The resist solution supply apparatus 200 in FIG. 6 includes a resist solution supply source (an example of a "treatment solution supply source" according to the present invention) 201 that stores the resist solution therein, and a buffer tank (a "temporary storage apparatus" according to the present invention) 202 that temporarily stores the resist solution transported from the resist solution supply source 201.

The resist solution supply source 201 is replaceable, and a first treatment solution supply pipe 251 that transports the resist solution to the buffer tank 202 is provided at an upper portion of the resist solution supply source 201. The first treatment solution supply pipe 251 is provided with a supply valve 203.

Further, on the downstream side of the supply valve 203 in the first treatment solution supply pipe 251, an air supply pipe 252 is provided which connects with a pressurization source 204 for pressurizing the inside of the buffer tank 202 to drain the resist solution in the buffer tank 202. The air supply pipe 252 is provided with a changeover valve 205.

The buffer tank 202 temporarily stores the resist solution transported from the replaceable resist solution supply source 201, and has a pressure-feeding function of pressure-feeding the treatment solution stored therein. The buffer tank 202 is composed of, for example, a tubephragm pump and includes a flexible diaphragm 202a, and the diaphragm 202a forms a storage chamber 202b that temporarily stores the resist solution as illustrated in FIG. 7A and FIG. 7B. The capacity inside the storage chamber 202b is variable by deformation of the diaphragm 202a, thus making it possible to minimize the contact between the resist solution and gas inside the storage chamber 202b also at the replacement of the resist solution supply source 201.

At an upper portion of the buffer tank 202, a drain pipe 253 used in draining the resist solution in the tank 202 is provided, and the drain pipe 253 is provided with a drain valve 206.

Further, to the buffer tank 202, an electropneumatic regulator 207 for deforming the diaphragm 202a is connected via a supply/exhaust pipe 254. To the electropneumatic regulator 207, an air supply pipe 255 connecting with a pressurization source 208 is connected, and an exhaust pipe 256 connecting with a depressurization source 209 is connected. Adjusting the pressure by the pressurization source 208 and the pressure by the depressurization source 209 enables deformation of the diaphragm 202a. The supply/exhaust pipe 254 is provided with a pressure sensor 210 that measures the pressure (air pressure) in the pipeline, namely, the pressure for deforming the diaphragm 202a.

Figure 8C:
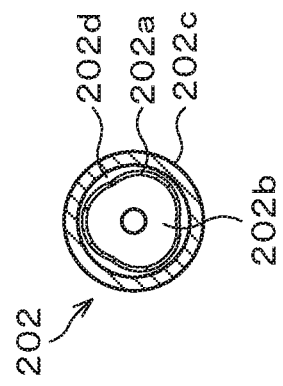
FIG. 8A to FIG. 8C are explanatory views of a structure of the buffer tank.
Figure 8B:
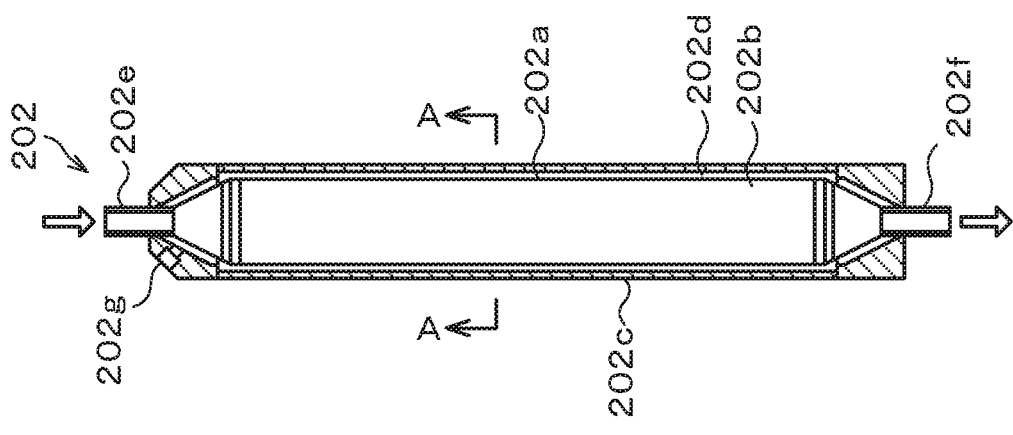
Figure 8A:
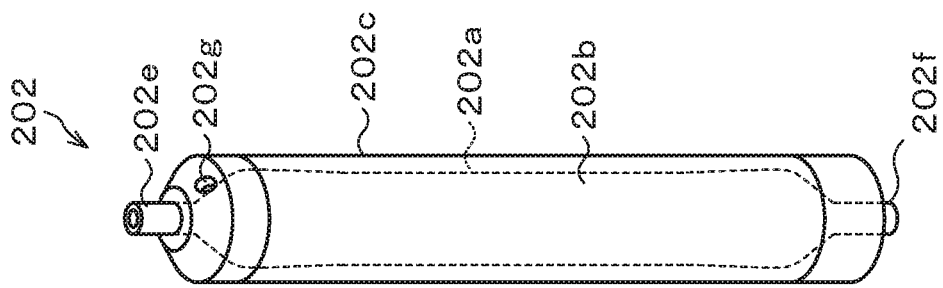

FIG. 8A to FIG. 8C are explanatory views of a structure of the buffer tank 202, FIG. 8A is an external view, FIG. 8B is a cross-sectional view illustrating only a later-described outer peripheral wall in a cross section, and FIG. 8C is a cross-sectional view taken along A-A.

The tubephragm pump constituting the buffer tank 202 has, for example, the diaphragm 202a and an outer peripheral wall 202c as illustrated in FIG. 8A to FIG. 8C. In this buffer tank 202, a space formed by the outer peripheral wall 202c in a cylindrical shape is partitioned by the flexible diaphragm 202a into the storage chamber 202b and an operating chamber 202d. Controlling the pressure in the operating chamber 202d by the electropneumatic regulator 207 makes it possible to transport the resist solution from the resist solution supply source 201 to the storage chamber 202b and to pressure-feed the resist solution at a desired hydraulic pressure from the storage chamber 202b.

Further, an entry side port 202e, to which the first treatment solution supply pipe 251 and the drain pipe 253 are connected, is provided at an upper end of the diaphragm 202a, and an exit side port 202f, to which a later-described second treatment solution supply pipe 257b is connected, is provided at a lower end. Further, a connection port 202g, to which the supply/exhaust pipe 254 is connected, is provided at an upper portion of the outer peripheral wall 202c.

Note that the diaphragm 202a and the outer peripheral wall 202c are formed of, for example, a fluorocarbon resin. Since they are transparent because of use of the fluorocarbon resin, the state of the resist solution therein can be detected by a photoelectric sensor or the like. Further, the diaphragm 202a and the outer peripheral wall 202c can be welded to each other to seal the inside of the outer peripheral wall 202c and thereby form the operating chamber 202d.

The description is returned to FIG. 6.

At a lower portion of the buffer tank 202, the second treatment solution supply pipe 257 that transports the resist solution to a pump 211 is provided. In other words, the pump 211 is provided on the downstream side of the buffer tank 202 in the second treatment solution supply pipe 257.

Further, between the buffer tank 202 and the pump 211 in the second treatment solution supply pipe 257, a filter 212 that removes particles in the resist solution is provided. The filter 212 is provided with a drain pipe 258 for draining air bubbles generated in the resist solution. The drain pipe 258 is provided with a drain valve 213.

Further, a supply valve 214 is provided on the upstream side of the filter 212 in the second treatment solution supply pipe 257, and a changeover valve 215 is provided between the filter 212 and the pump 211 in the second treatment solution supply pipe 257.

The pump 211 is, for example, a tubephragm pump and has a not-illustrated storage chamber that stores the resist solution, and an electropneumatic regulator 216 for performing control and so on of the discharge amount of the resist solution from the pump 211 is connected to the pump 211 via a supply/exhaust pipe 259. To the electropneumatic regulator 216, an air supply pipe 260 connecting with a pressurization source 217 is connected, and an exhaust pipe 261 connecting with a depressurization source 218 is connected.

The pump 211 is provided with a third treatment solution supply pipe 262 that supplies the resist solution onto the wafer as a treatment body from the pump 211 via the coating nozzle 142. The third treatment solution supply pipe 262 is provided with a pressure sensor 219 that measures the hydraulic pressure of the resist solution in the third treatment solution supply pipe 262.

Further, a changeover valve 220 is provided on the downstream side of the pressure sensor 219 in the third treatment solution supply pipe 262, and a supply control valve 221 is provided on the downstream side of the changeover valve 220 and near the coating nozzle 142.

Further, the resist solution supply apparatus 200 includes a return pipe 263 for returning the resist solution in the pump 211 to the buffer tank 202. On end of the return pipe 263 is connected between the pressure sensor 219 and the changeover valve 220 in the third treatment solution supply pipe 262, and the other end is connected between the supply valve 214 and the filter 212 in the second treatment solution supply pipe 257. Further, the return pipe 263 is provided with a return control valve 222.

Further, the resist solution supply apparatus 200 includes a not-illustrated control unit. For each of the valves provided in the resist solution supply apparatus 200, an electromagnetic valve or an air-operated valve controllable by the control unit is used, and each of the valves and the control unit are electrically connected. Further, the control unit is electrically connected to the pressure sensor 210, the pressure sensor 219, and the electropneumatic regulators 207, 216. This configuration enables a series of treatments in the resist solution supply apparatus 200 to be automatically performed under control of the control unit. Note that the "control apparatus" of the present invention is composed of, for example, the control unit and the electropneumatic regulators 207, 216.

Next, the operation of the resist solution supply apparatus 200 will be described based on FIG. 9 to FIG. 12.

(Replenishment to the Buffer Tank 202)

Figure 9:
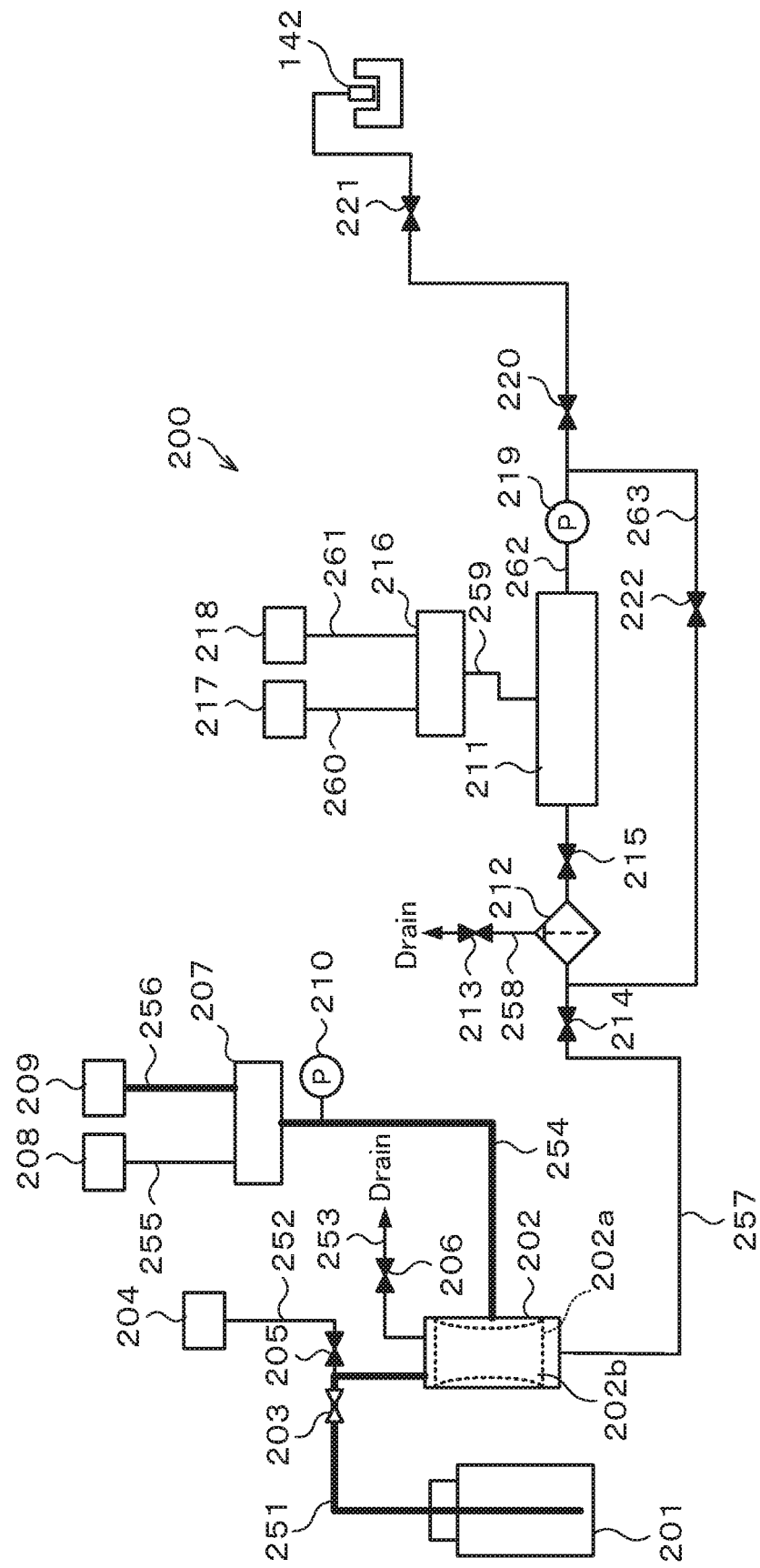
FIG. 9 illustrates a piping system for explaining the outline of a configuration of a resist solution supply apparatus and is an explanatory diagram of a state where a step of replenishing the buffer tank is performed.

As illustrated in FIG. 9, based on a control signal from the control unit, the supply valve 203 provided in the first treatment solution supply pipe 251 is brought into an open state, and the pressure in the storage chamber 202b of the buffer tank 202 is reduced by the electropneumatic regulator 207 and the depressurization source 209, thereby supplying the resist solution from the resist solution supply source 201 into the storage chamber 202b of the buffer tank 202. In this event, the pressure in the storage chamber 202b, namely, the pressure in the operating chamber 202d is feedback-controlled based on the measured result by the pressure sensor 210.

Note that in FIG. 9 and subsequent drawings, valves in an open state are illustrated in white, valves in a closed state are illustrated in black, and pipes in which fluid such as the resist solution or the like flows are illustrated in bold, thereby omitting the description of the open/closed state of the other valves.

(Replenishment to the Pump 211)

Figure 10:
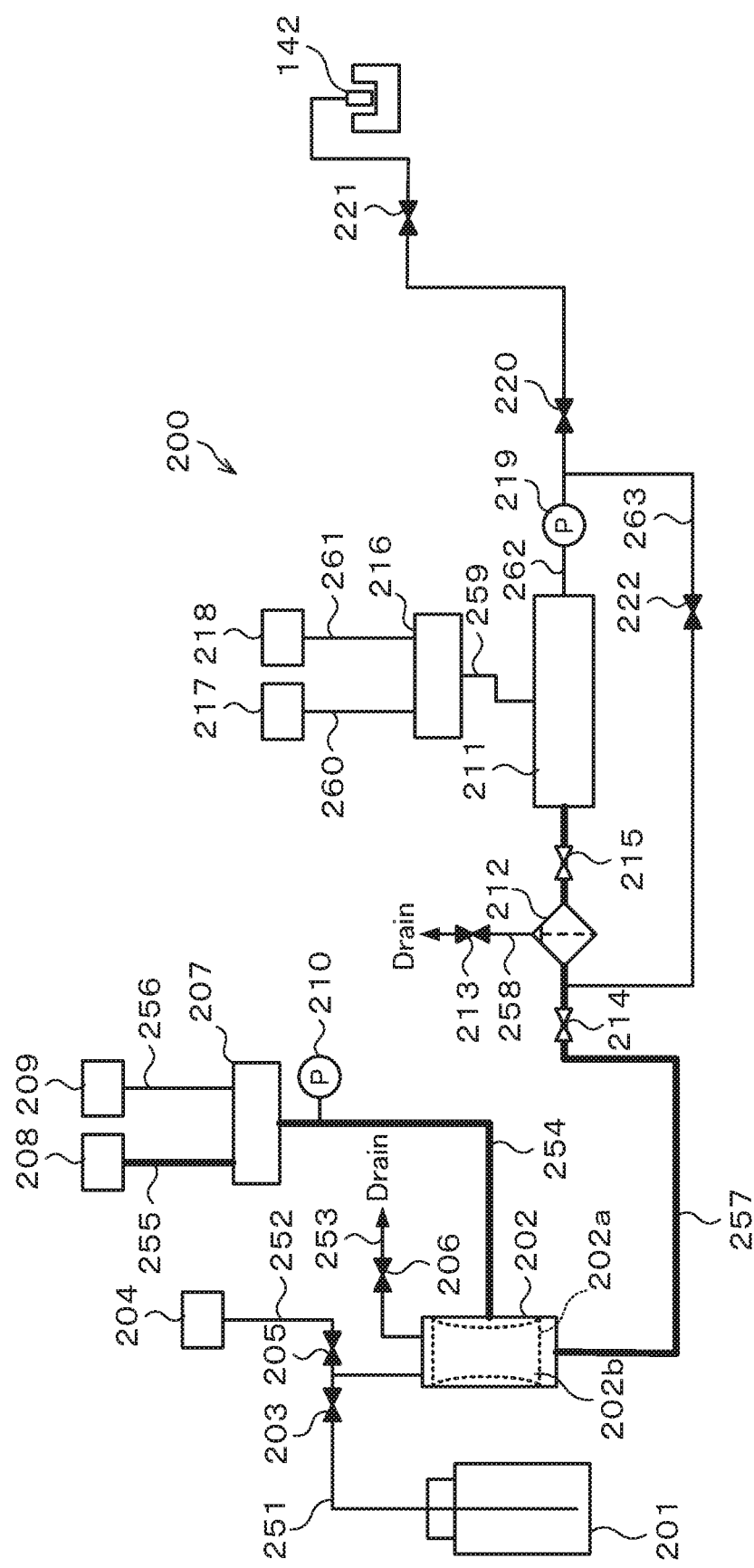
FIG. 10 illustrates the piping system for explaining the outline of the configuration of the resist solution supply apparatus and is an explanatory diagram of a state where a step of replenishing a pump is performed.

Once the storage chamber 202b of the buffer tank 202 is supplied/replenished with a predetermined amount of resist solution, the supply valve 203 is brought into a closed state, and the supply valve 214 and the changeover valve 215 provided in the second treatment solution supply pipe 257 are brought into an open state as illustrated in FIG. 10. In addition to that, the connection destination of the buffer tank 202 is changed over to the pressurization source 208 by the electropneumatic regulator 207 to pressurize the storage chamber 202b of the buffer tank 202, thereby pressure-feeding the resist solution in the storage chamber 202b from the buffer tank 202 to the second treatment solution supply pipe 257. The pressure-fed resist solution passes through the filter 212, and is then transported to the pump 211. In this event, the pressure in the third treatment solution supply pipe 262, namely, the pressure in the pump 211 communicating with the supply pipe 262 being equivalent to the pressure on the secondary side of the filter 212 is measured by the pressure sensor 219. Then, based on the measured result, the hydraulic pressure at the time of pressure-feeding the treatment solution from the storage chamber 202b of the buffer tank 202 is feedback-controlled so that the hydraulic pressure on the secondary side of the filter 212 measured by the pressure sensor 219 becomes a desired value.

(Discharge)

Figure 11:
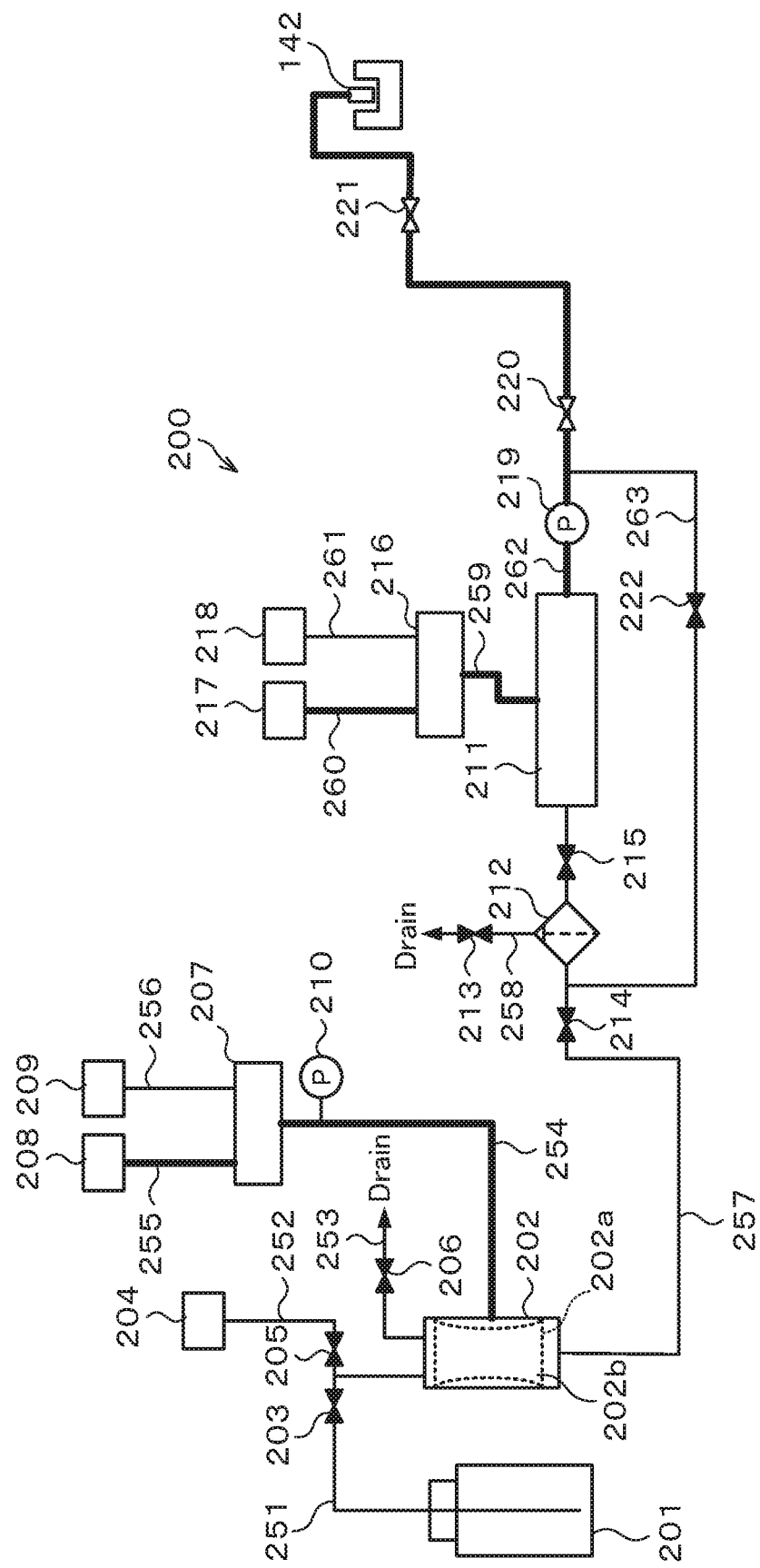
FIG. 11 illustrates the piping system for explaining the outline of the configuration of the resist solution supply apparatus and is an explanatory diagram of a coating step.

Once the pump 211 is supplied/replenished with the predetermined amount of resist solution, the supply valve 214 and the changeover valve 215 are brought into a closed state, and the changeover valve 220 and the supply control valve 221 provided in the third treatment solution supply pipe 262 are brought into an open state as illustrated in FIG. 11. In addition to that, the connection destination of the pump 211 is changed over to the pressurization source 217 by the electropneumatic regulator 216 to pressure-feed the resist solution from the pump 211 to the third treatment solution supply pipe 262. This discharges a part (for example, one-fifth) of the resist solution transported to the pump 211 to the wafer via the coating nozzle 142. In this event, the pressure in the pump 211 is feedback-controlled based on the measured result of the pressure in the third treatment solution supply pipe 262 by the pressure sensor 219.

(Return)

Figure 12:
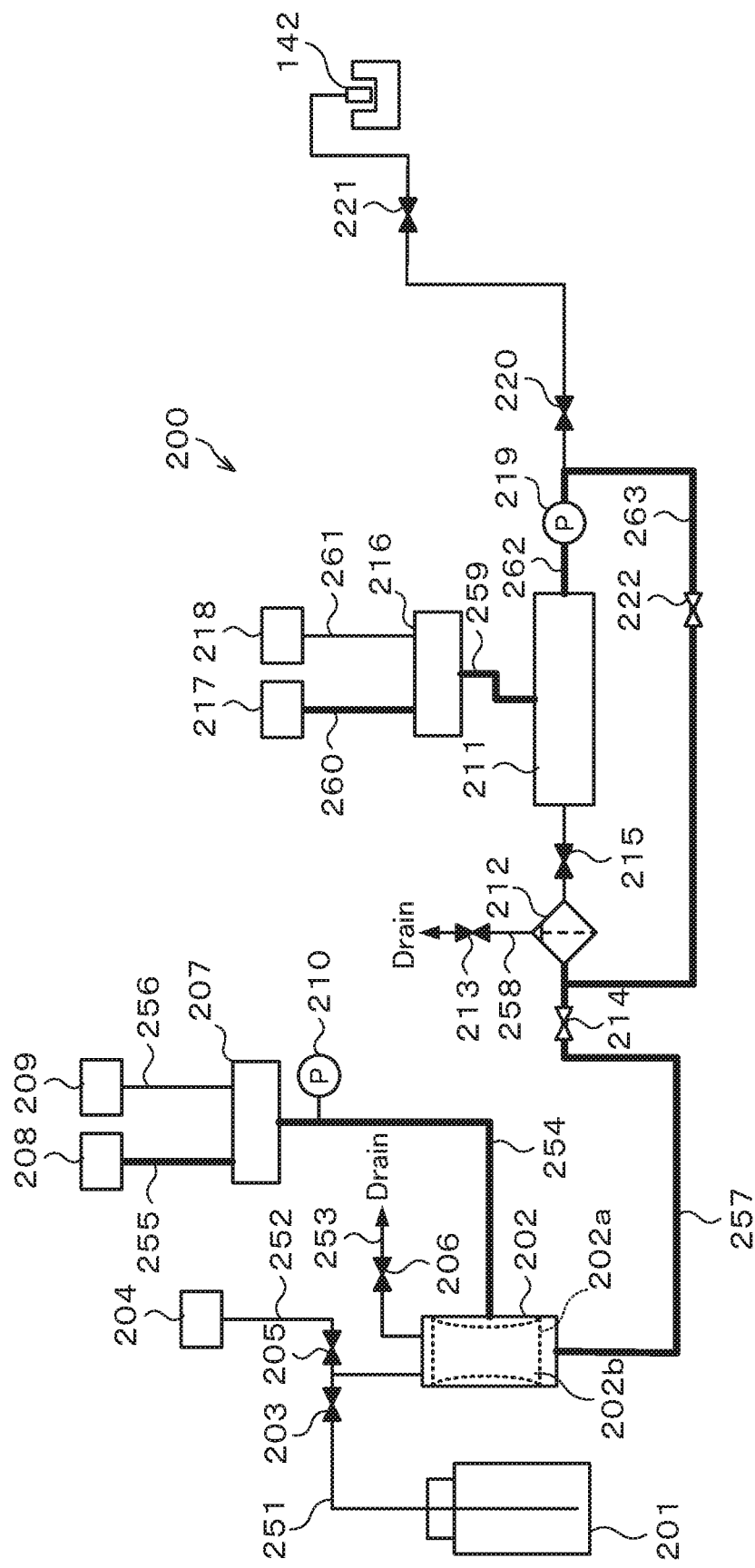
FIG. 12 illustrates the piping system for explaining the outline of the configuration of the resist solution supply apparatus and is an explanatory diagram of a step of returning the resist solution to the buffer tank.

Once the predetermined amount of the resist solution is drained from the pump 211, the changeover valve 220 and the supply control valve 221 are brought into a closed state and the return control valve 222 and the supply valve 214 are brought into an open state as illustrated in FIG. 12. In addition to that, the electropneumatic regulator 216 is controlled based on the measured results at the pressure sensor 210 and the pressure sensor 219 so that the pressure of the pump 211 becomes larger than the pressure in the storage chamber 202b of the buffer tank 202. As a result, the remaining resist solution (for example, four-fifths) in the pump 211 is returned to the buffer tank 202 via the return pipe 263.

Thereafter, the above operations are repeated.

As described above, the buffer tank 202 of the resist solution supply apparatus 200 has not only the function of temporarily storing the treatment solution but also the pressure-feeding function of pressure-feeding the treatment solution.

Accordingly, the resist solution supply apparatus 200 has the following effects. Specifically, if the buffer tank is a conventional one, it is impossible to set the hydraulic pressure in the filter 212 to a desired hydraulic pressure when the pump 211 is replenished with the resist solution from the buffer tank depending on the condition of installing the apparatus and the layout in the apparatus. However, the buffer tank 202 of the resist solution supply apparatus 200 has the pressure-feeding function, so that it is possible to set the hydraulic pressure in the filter 212 to a desired hydraulic pressure when the pump 211 is replenished with the resist solution in the resist solution supply apparatus 200 even with the same condition of installing the apparatus and layout in the apparatus.

In particular, the hydraulic pressure when pressure-feeding from the buffer tank 202 (hereinafter, pressure-feeding hydraulic pressure) is feedback-controlled so that the hydraulic pressure on the secondary side of the filter 212 becomes constant at a predetermined value, based on the hydraulic pressure of the resist solution in the third treatment solution supply pipe 262 measured by the pressure sensor 219, namely, the hydraulic pressure on the secondary side of the filter 212. Therefore, the hydraulic pressure in the filter 212 can be surely brought to the desired hydraulic pressure in replenishing the pump 211 with the resist solution from the buffer tank 202.

Note that if the hydraulic pressure of the resist solution decreases due to an increase in flow rate of the resist solution at passing through the filter 212 and decreases down to the saturation vapor pressure at that time, air bubbles are generated in the resist solution according to the principle of cavitation. However, in the resist solution supply apparatus 200, the hydraulic pressure on the secondary side of the filter 212 is controlled, so that the generation of bubbles can be suppressed by making the static pressure level higher than the saturation vapor pressure.

Further, the buffer tank 202 has the deformable storage chamber 202b storing the resist solution, and therefore has the following effects.

In the case where the resist solution in the resist solution supply source 201 is used up and the resist solution in the storage chamber of the buffer tank decreases, the solution level of the resist solution in the storage chamber lowers in a standard buffer tank. Therefore the inner peripheral surface of the storage chamber comes into contact with air and is dried, possibly resulting generation of defects on the wafer after treatment.

In contrast to the above, the storage chamber 202b of the buffer tank 202 is deformed as described above in the resist solution supply apparatus 200, thereby making it possible to prevent the inner peripheral surface of the storage chamber 202b from coming into contact with air even and drying if the amount of the resist solution in the storage chamber 202b decreases.

Note that the resist solution in the buffer tank 202 can be drained via the second treatment solution supply pipe 257 and the third treatment solution supply pipe 262 using the pressurization source 204. Further, the pressurization source 204 can be used also when performing solution passage treatment to the return pipe 263 and the filter 212. At the time of the solution passage treatment to the filter 212, the resist solution is drained via the drain pipe 258.

Further, though not illustrated, a pressurization source may be provided at the resist solution supply source 201 for the solution passage treatment of the resist solution to the buffer tank 202 and the first treatment solution supply pipe 251. At the time of the solution passage treatment, the resist solution is drained via the drain pipe 253.

(Another Example of Pressure-Feeding Control)

In the above example, the pressure-feeding hydraulic pressure is feedback-controlled so that the hydraulic pressure on the secondary side of the filter 212 becomes constant at a predetermined value. However, in place of that, the following control may be performed in the case where the hydraulic pressure on the secondary side of the filter 212 measured by the pressure sensor 219 falls within a predetermined range and there is no abnormality in the measured result. Specifically, the treatment solution may be pressure-fed from the buffer tank 202 by applying a predetermined constant pressure to the buffer tank 202, more specifically, the storage chamber 202*b* of the buffer tank 202 using the electropneumatic regulator 207.

(Still Another Example of Pressure-Feeding Control)

Figure 13:
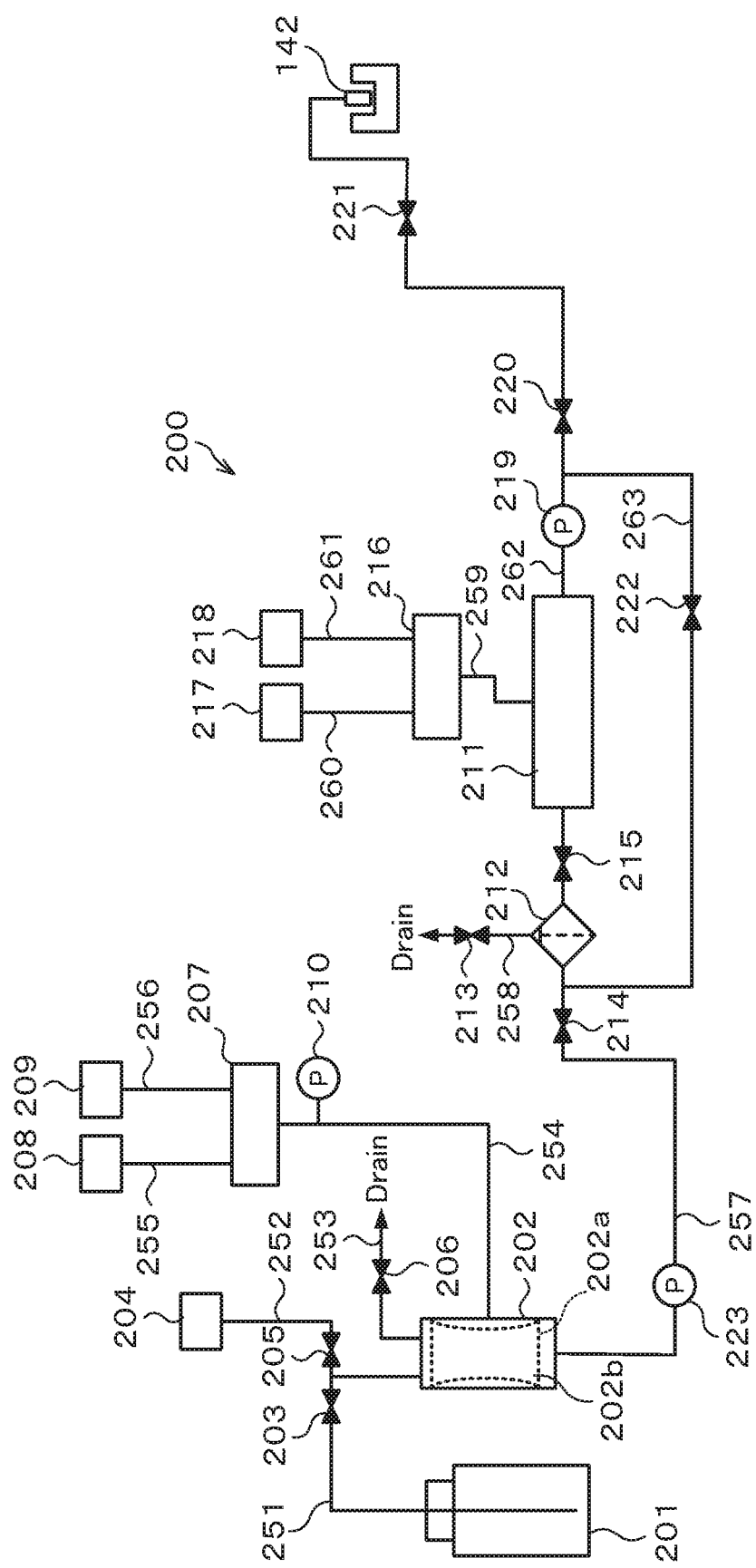
FIG. 13 is a diagram for explaining another example of control when pressure-feeding from the buffer tank.

FIG. 13 is a diagram explaining still another example of the control when pressure-feeding from the buffer tank 202.

The resist solution supply apparatus 200 in FIG. 13 is provided with a pressure sensor 223 that measures the hydraulic pressure in the second treatment solution supply pipe 257, between the buffer tank 202 and the supply valve 214 in the second treatment solution supply pipe 257.

The pressure-feeding hydraulic pressure may be feedback-controlled using the electropneumatic regulator 207 so that the hydraulic pressure on the primary side of the filter 212 measured by the pressure sensor 223 becomes constant at a predetermined value.

Second Embodiment

Figure 14:
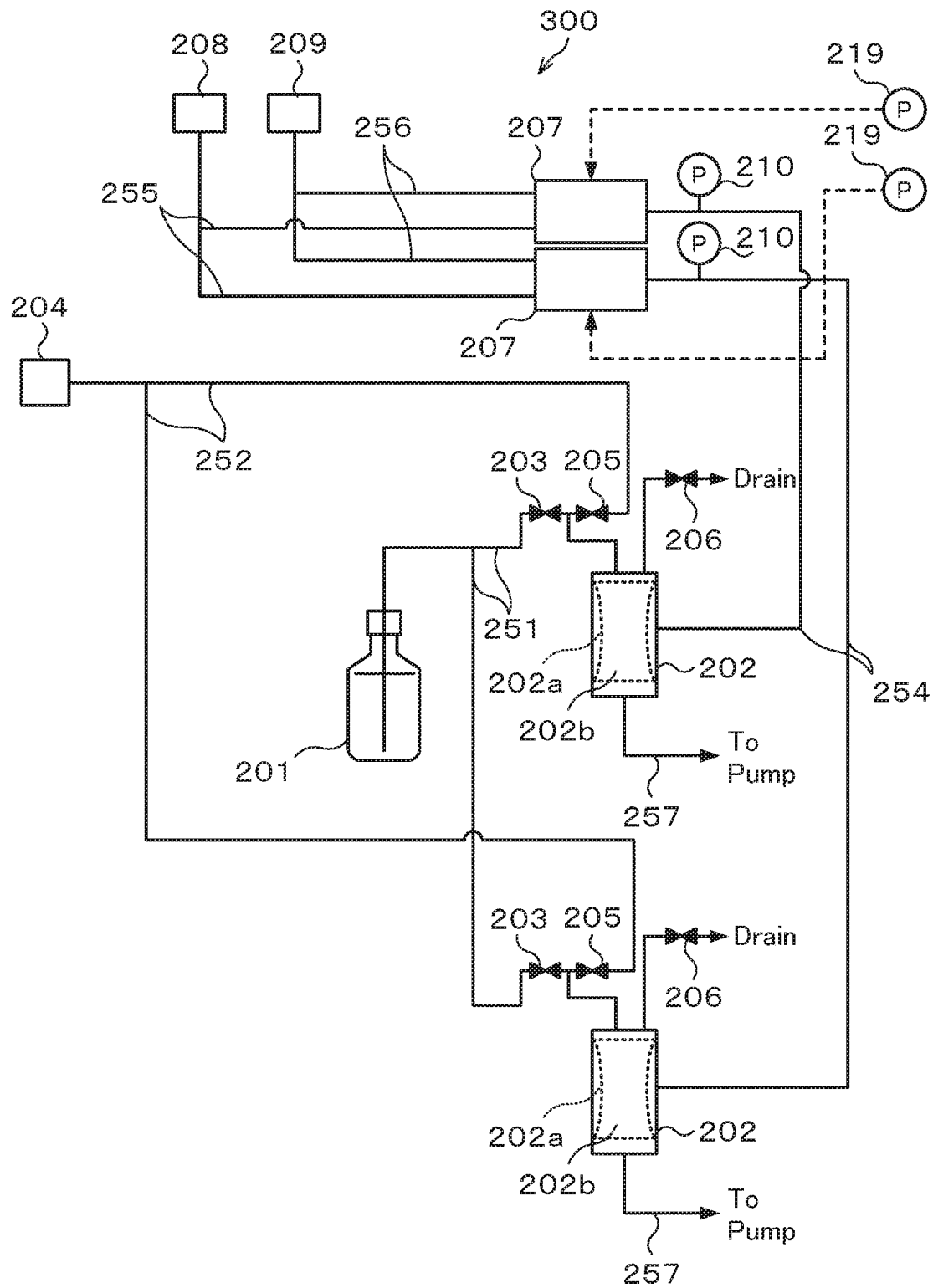
FIG. 14 is an explanatory diagram illustrating the outline of a configuration of a resist solution supply apparatus according to a second embodiment of the present invention.
Figure 15:
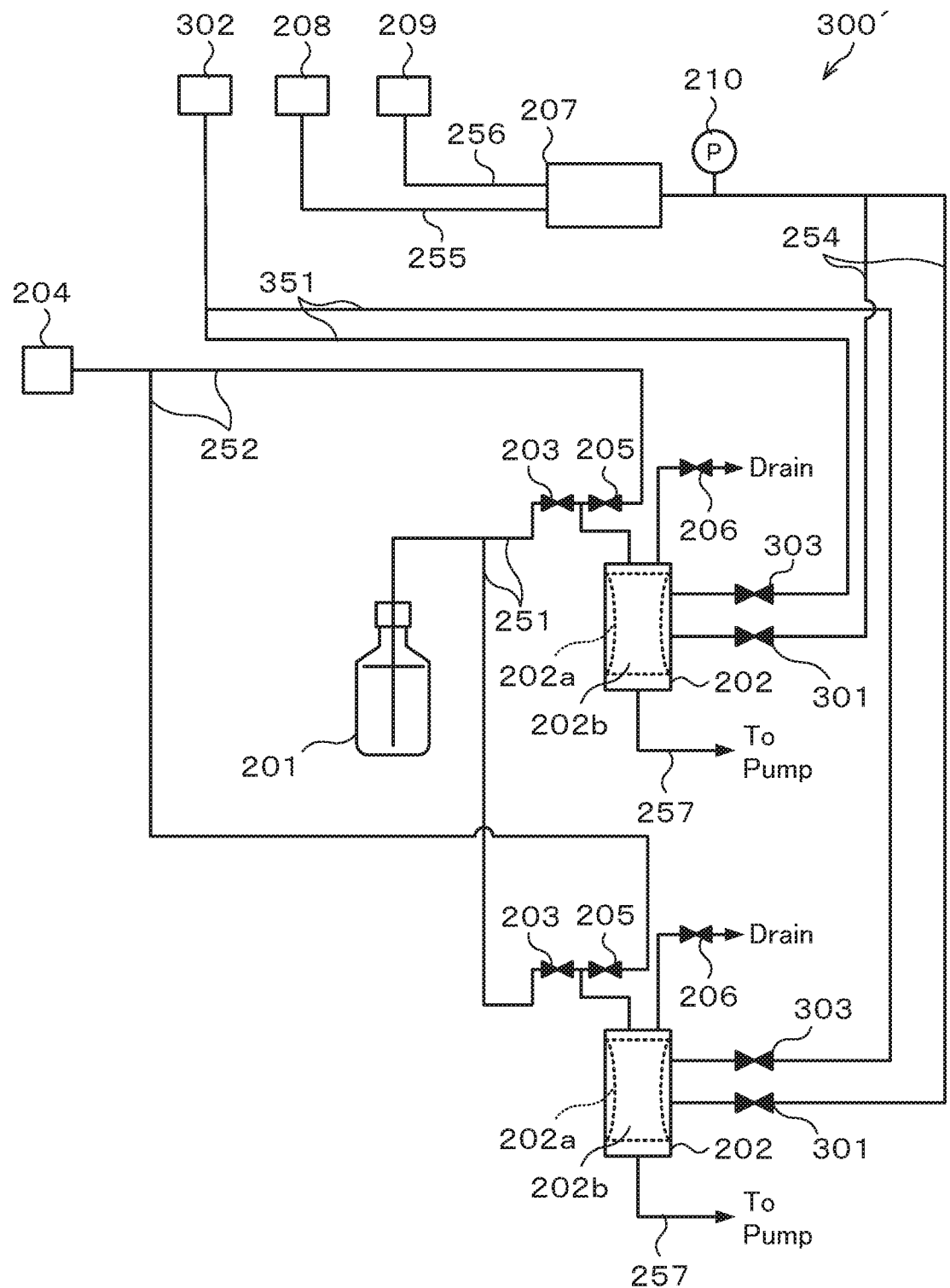
FIG. 15 is a diagram illustrating the outline of a configuration of a resist solution supply apparatus according to a comparative form.

FIG. 14 is an explanatory diagram illustrating the outline of a configuration of a resist solution supply apparatus according to a second embodiment of the present invention. FIG. 15 is a diagram illustrating the outline of a configuration of a resist solution supply apparatus according to a comparative form.

The configurations on the downstream of buffer tanks of the resist solution supply apparatuses according to this embodiment and the comparative form are the same as that of the resist solution supply apparatus 200 in FIG. 6, and therefore illustration thereof will be omitted.

A resist solution supply apparatus 300 in FIG. 14 is provided with two buffer tanks 202 for one resist solution supply source 201, unlike the resist solution supply apparatus 200 in FIG. 6. Further, in the resist solution supply apparatus 300, an electropneumatic regulator 207 is provided for each of the buffer tanks 202 so as to be able to apply a different pressure for each of storage chambers 202*b* of the buffer tanks 202.

On the other hand, a resist solution supply apparatus 300' in FIG. 15 is provided with an electropneumatic regulator 207 common to two buffer tanks 202. Therefore, the pressures that can be applied to storage chambers 202*b* of the buffer tanks 202 are the same for the two storage chambers 202*b*.

Therefore, the resist solution supply apparatus 300' has the following problem. Once replenishment to the buffer tanks 202 from a resist solution supply source 201 cannot be performed any longer, at the time when the resist solution is pressure-fed from one of the buffer tanks 202, a diaphragm 202*a* is deformed such that the storage chamber 202*b* of the one buffer tank 202 contracts, and does not return to the original shape. Accordingly, the resist solution cannot be pressure-fed at a desired pressure unless a larger pressure is applied to the storage chamber 202*b* of the one buffer tank 202. However, when the pressure in the storage chamber 202*b* of the one buffer tank 202 is tried to be increased, the pressure in the storage chamber 202*b* of the other buffer tank 202 where the desired pressure can be obtained also increases, so that the pressure at the time of pressure-feeding from the storage chamber 202*b* of the other buffer tank 202 becomes larger than the desired pressure.

As described above, the resist solution supply apparatus 300' has the problem at the time when the replenishment to the buffer tanks 202 from the resist solution supply source 201 cannot be performed any longer, namely, at the time of replacement of the resist solution supply source 201.

In contrast to the above, in the resist solution supply apparatus 300 in FIG. 14, a different pressure can be applied for each of the storage chambers 202*b* of the buffer tanks 202, so that even if the storage chamber 202*b* of the buffer tank 202 is deformed into a smaller size at the time of replacement of the resist solution supply source 201, the resist solution can be pressure-fed from the buffer tank 202 at the desired pressure.

Note that in the resist solution supply apparatus 300, the pressure-feeding hydraulic pressure from the buffer tank 202 is feedback-controlled so that, for example, the hydraulic pressure on the secondary side of the filter 212 measured by the pressure sensor 219 becomes constant at the predetermined value. Further, in the case where the hydraulic pressure on the secondary side of the filter 212 measured by the pressure sensor 219 falls with a predetermined range, the treatment solution may be pressure-fed from the buffer tank 202 by applying the predetermined constant pressure to the storage chamber 202*b* of the buffer tank 202 using the electropneumatic regulator 207 as in the first embodiment. Further, a pressure sensor that measures the hydraulic pressure in the second treatment solution supply pipe 257 may be provided to feedback-control the pressure-feeding hydraulic pressure from the buffer tank 202 using the electropneumatic regulator 207 so that the hydraulic pressure on the primary side of the filter 212 measured by the pressure sensor becomes constant at a predetermined value.

Besides, even in the configuration having the electropneumatic regulator 207 common to the buffer tanks 202 as in the resist solution supply apparatus 300' in FIG. 15, the above problem at the time of replacement of the resist solution supply source 201 does not occur in the case where the reaction force is small if the diaphragm 202*a* in the buffer tank 202 is deformed.

Note that in the resist solution supply apparatus 300', changeover valves 301 are provided in supply/exhaust pipes 254 connecting the buffer tanks 202 and the electropneumatic regulator 207. Further, the buffer tanks 202 are provided with exhaust pipes 351 connected with a depressurization source 302, and the exhaust pipes 351 are provided with exhaust valves 303. In the resist solution supply apparatus 300', at the time of replenishing the buffer tanks 202 with the resist solution, the changeover valves 301 are brought into a closed state, the supply valves 203 are brought into an open state, and the exhaust valves 303 are brought into an open state, thereby reducing the pressures in the storage chambers 202b of the buffer tanks 202. As a result, the resist solution is supplied from the resist solution supply source 201 into the storage chambers 202b of the buffer tanks 202.

Third Embodiment

Figure 16:
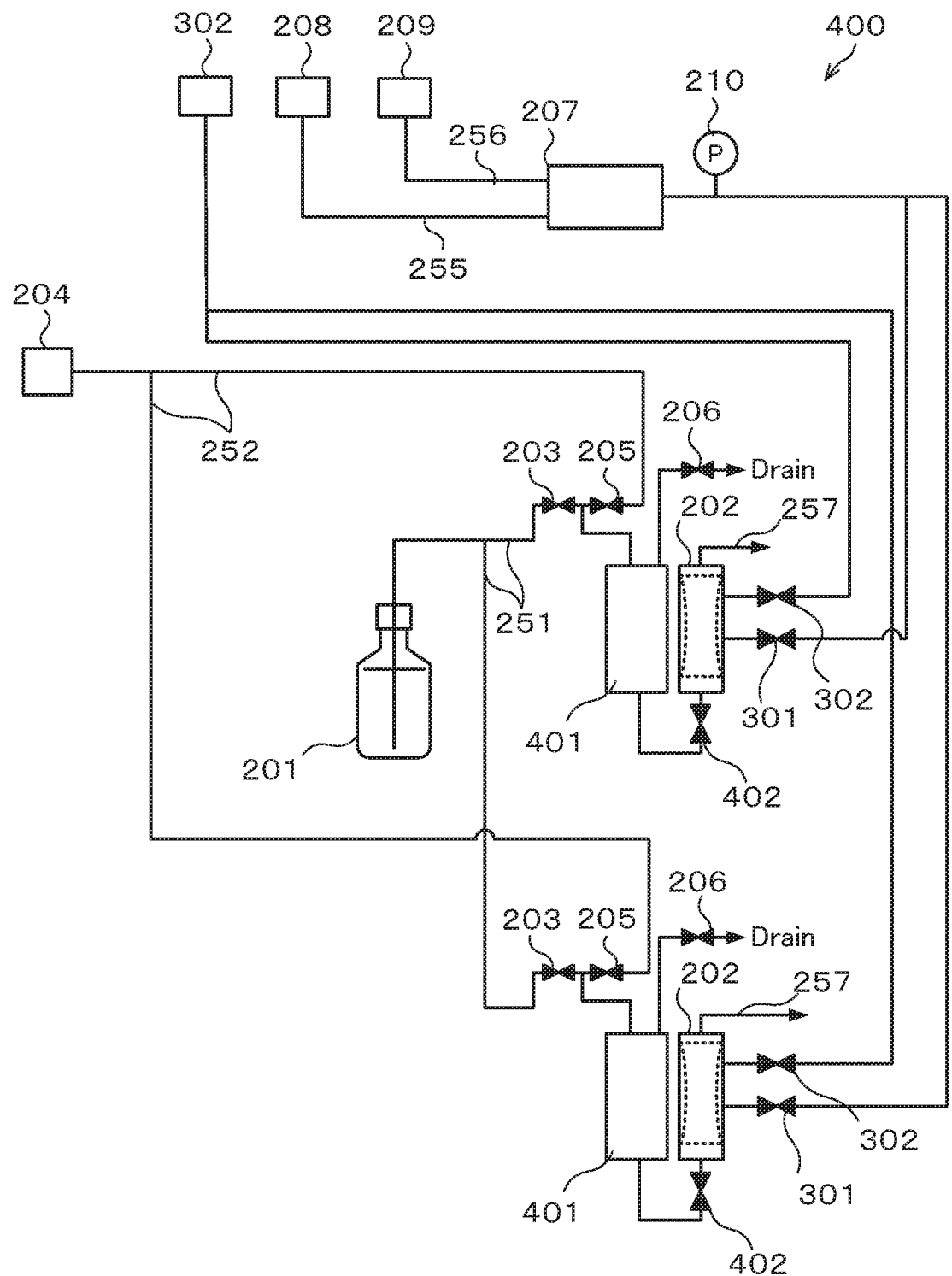
FIG. 16 is an explanatory diagram illustrating the outline of a configuration of a resist solution supply apparatus according to a third embodiment of the present invention.

FIG. 16 is an explanatory diagram illustrating the outline of a configuration of a resist solution supply apparatus according to a third embodiment of the present invention.

A resist solution supply apparatus 400 in FIG. 16 is provided with an electropneumatic regulator 207 common to two buffer tanks 202 as in the resist solution supply apparatus 300' in FIG. 15. The resist solution supply apparatus 400 in FIG. 16 is, however, provided with other buffer tanks 401 between a resist solution supply source 201 and buffer tanks 202 in first treatment solution supply pipes 251, unlike the resist solution supply apparatus 300' in FIG. 15. The other buffer tanks 401 are standard tanks having no pressure-feeding function.

In this resist solution supply apparatus 400, even if the resist solution is pressure-fed from one of the buffer tanks 202 in a state where the resist solution supply source 201 is empty, and a diaphragm 202a is deformed such that a storage chamber 202b of the one buffer tank 202 contracts, the one buffer tank 202 is replenished with the resist solution from the other buffer tank 401, so that the diaphragm 202a returns to the original shape. Accordingly, even when the replacement of the resist solution supply source 201 is required, the resist solution can be pressure-fed from the buffer tank 202 at a desired pressure.

Note that between the other buffer tanks 401 and the buffer tanks 202 in the first treatment solution supply pipes 251, changeover valves 402 are provided.

Fourth Embodiment

Figure 17:
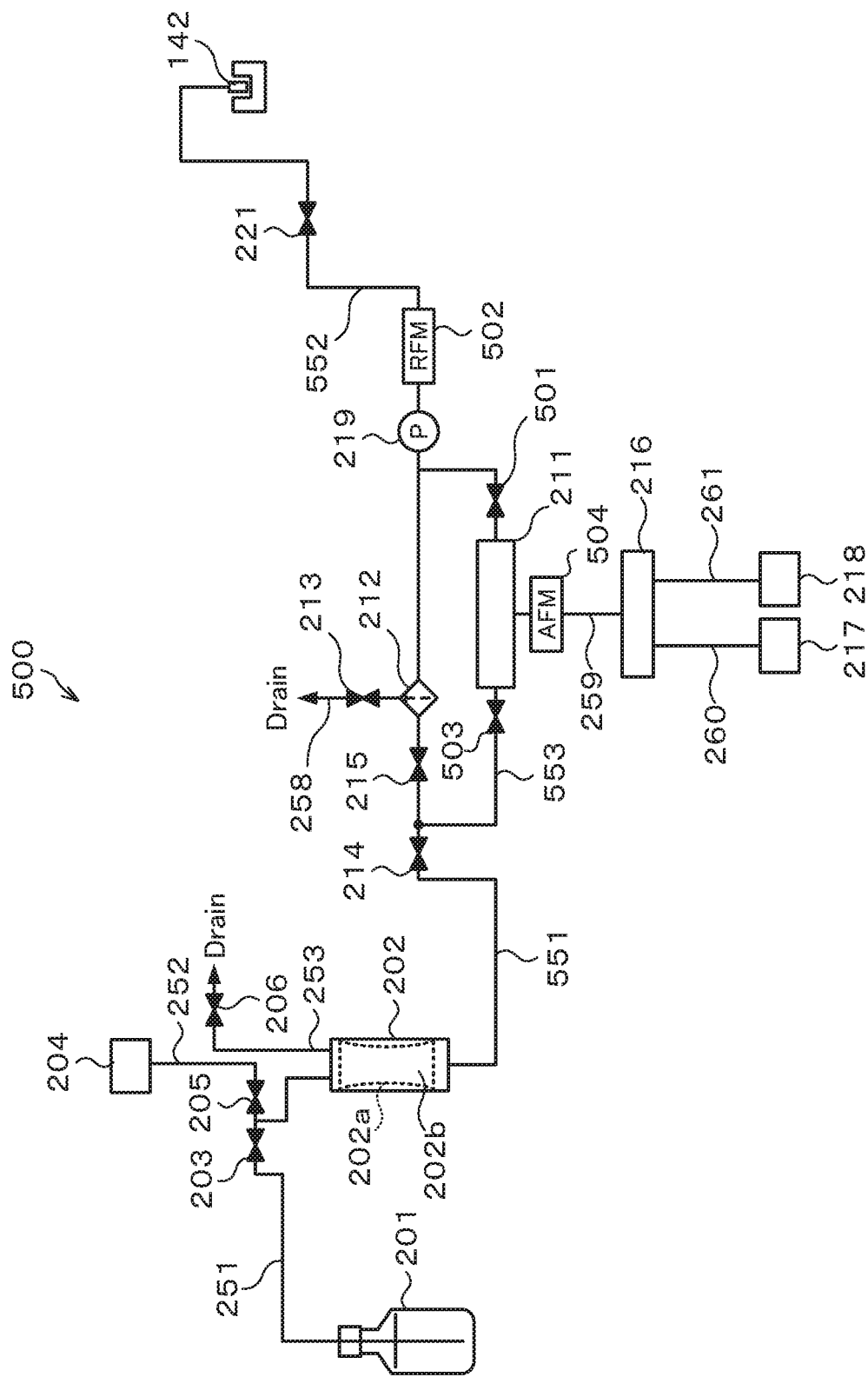
FIG. 17 is an explanatory diagram illustrating the outline of a configuration of a resist solution supply apparatus according to a fourth embodiment of the present invention.

FIG. 17 is an explanatory diagram illustrating the outline of a configuration of a resist solution supply apparatus according to a fourth embodiment of the present invention.

In a resist solution supply apparatus 500 in FIG. 17, at a lower part of a buffer tank 202, a second treatment solution supply pipe 551 is provided which transports the resist solution to a pump 211 being a tubephragm pump. In other words, the buffer tank 202 is connected one end of the second treatment solution supply pipe 551, and one of ports (refer to signs 202e, 202f in FIG. 8A and FIG. 8B) of the pump 211 is connected to the other end.

Between the buffer tank 202 and the pump 211 in the second treatment solution supply pipe 551, a filter 212 is provided. Further, a supply valve 214 is provided between the buffer tank 202 and the filter 212 in the second treatment solution supply pipe 551, and a changeover valve 215 is provided between the supply valve 214 and the filter 212. Further, a changeover valve 501 is provided between the filter 212 and the pump 211 in the second treatment solution supply pipe 551.

The resist solution supply apparatus 500 is provided with a third treatment solution supply pipe 552 that supplies the resist solution from the pump 211 onto the wafer via a coating nozzle 142. One end of the third treatment solution supply pipe 552 is connected between the filter 212 and the changeover valve 501 in the second treatment solution supply pipe 551, and the other end is connected with the coating nozzle 142. The third treatment solution supply pipe 552 is provided with a pressure sensor 219, a liquid flow meter 502, a supply control valve 221, and the coating nozzle 142 in order from the upstream side.

The resist solution supply apparatus 500 is further provided with a return pipe 553. The return pipe 553 is, for example, used at the time of returning the resist solution in the pump 211 to the buffer tank 202. One end of the return pipe 553 is connected between the supply valve 214 and the changeover valve 215 in the second treatment solution supply pipe 551, and the other end is connected to the other port (refer to signs 202e, 202f in FIG. 8A and FIG. 8B) on the side of the pump 211 opposite to the connection side of the second treatment solution supply pipe 551. Further, the return pipe 553 is provided with a changeover valve 503.

In the resist solution supply apparatus 500, a gas flow meter 504 is further provided in a supply/exhaust pipe 259 provided between the pump 211 and an electropneumatic regulator 216.

Next, the operation of the resist solution supply apparatus 500 will be described based on FIG. 18 to FIG. 27.

(Replenishment to the Pump 211)

Figure 18:
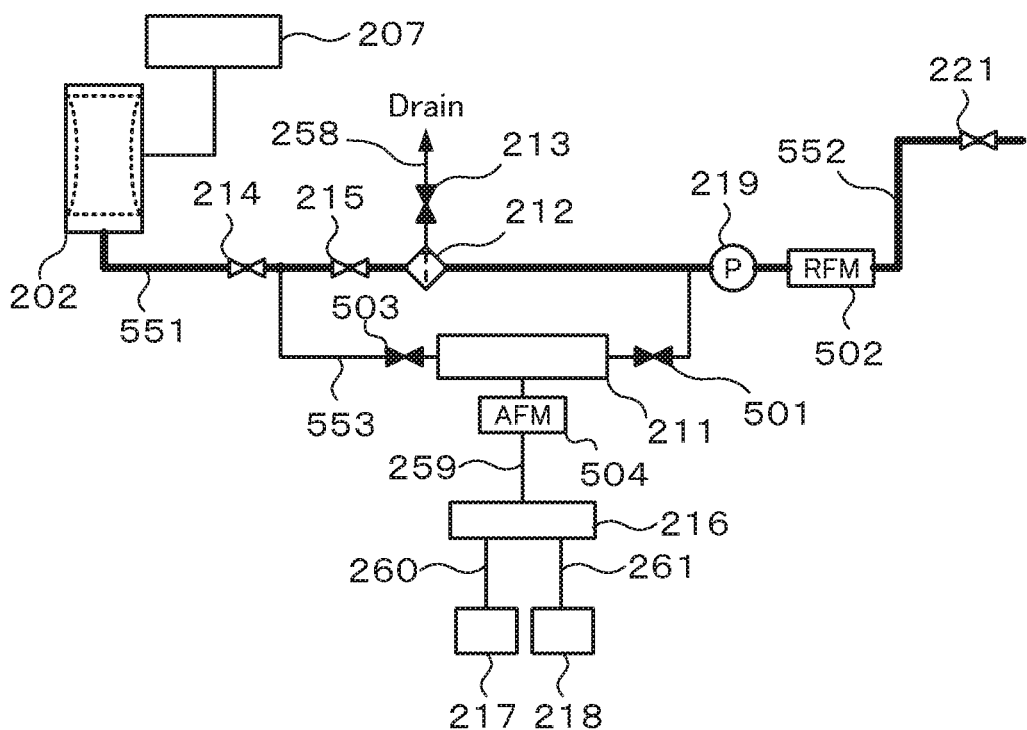
FIG. 18 illustrates the piping system for explaining the outline of the configuration of the resist solution supply apparatus and is an explanatory diagram of a step of replenishing the pump or a vent step.

As illustrated in FIG. 18, the supply valve 214 and the changeover valve 215 are brought into an open state while the changeover valve 501 provided in the second treatment solution supply pipe 551 and the changeover valve 503 provided in the return pipe 553 are kept in a closed state, and the supply control valve 221 is brought into an open state. In this state, the resist solution is sent from the buffer tank 202. The hydraulic pressure in the third treatment solution supply pipe 552 at that time is measured by the pressure sensor 219. The measured hydraulic pressure is almost equal to the back pressure applied to the pump 211 at the time of supply/replenishment of the resist solution from the buffer tank 202.

Figure 19:
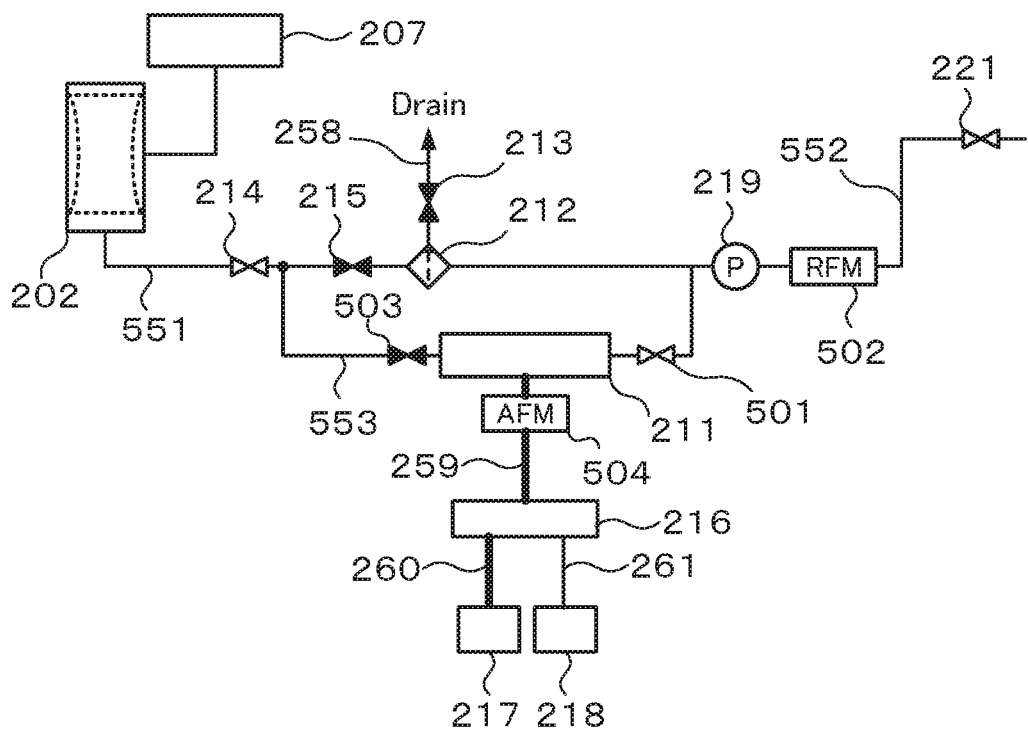
FIG. 19 illustrates the piping system for explaining the outline of the configuration of the resist solution supply apparatus and is an explanatory diagram of the step of replenishing the pump.

Then, as illustrated in FIG. 19, the changeover valve 215 is brought into a closed state, the sending of the resist solution from the buffer tank 202 is stopped, and the changeover valve 501 is brought into an open state. Then, the pressure in the operating chamber in the pump 211 is controlled by the electropneumatic regulator 216 so that the pressure measured by the pressure sensor 219, namely, the pressure on the changeover valve 501 side of the pump 211 becomes equal to the pressure measured by the pressure sensor 219 at the time of sending the resist solution from the buffer tank 202.

Figure 20:
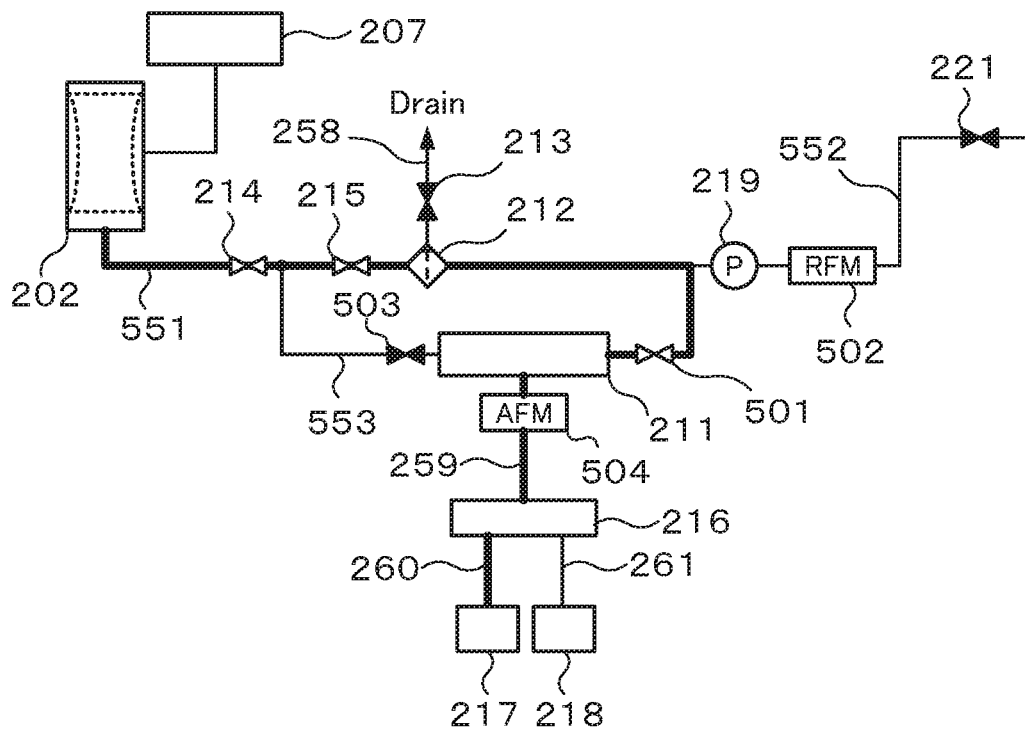
FIG. 20 illustrates the piping system for explaining the outline of the configuration of the resist solution supply apparatus and is an explanatory diagram of the step of replenishing the pump.

Thereafter, as illustrated in FIG. 20, the supply control valve 221 is brought into a closed state, the changeover valve 215 is brought into an open state, and replenishment of the resist solution from the buffer tank 202 is started. In this event, the pressure on the changeover valve 501 side of the pump 211 is made to be equal to the pressure measured by the pressure sensor 219 at the time of sending the resist solution from the buffer tank 202, namely, the back pressure applied to the pump 211 at the time of replenishment of the resist solution from the buffer tank 202, so that the resist solution never momentarily flows into the pump 211 due to fluctuation in back pressure at the time of starting the replenishment.

(Another Example of Replenishment to the Pump 211)

As illustrated in FIG. 18, the supply valve 214 and the changeover valve 215 are brought into an open state first while the changeover valve 501 provided in the second treatment solution supply pipe 551 and the changeover valve 503 provided in the return pipe 553 are kept in a closed state, and the supply control valve 221 is brought into an open state. In this state, the resist solution is sent from the buffer tank 202. The pressure on the secondary side of the filter 212, specifically, the hydraulic pressure in the third treatment solution supply pipe 552 is measured by the pressure sensor 219. Together with the pressure measurement, the pressure in the operating chamber in the buffer tank 202 is controlled by the electropneumatic regulator 207, thereby performing feedback-control so that the pressure measured by the pressure sensor 219 becomes a target pressure (for example, 50 kPa).

Figure 21:
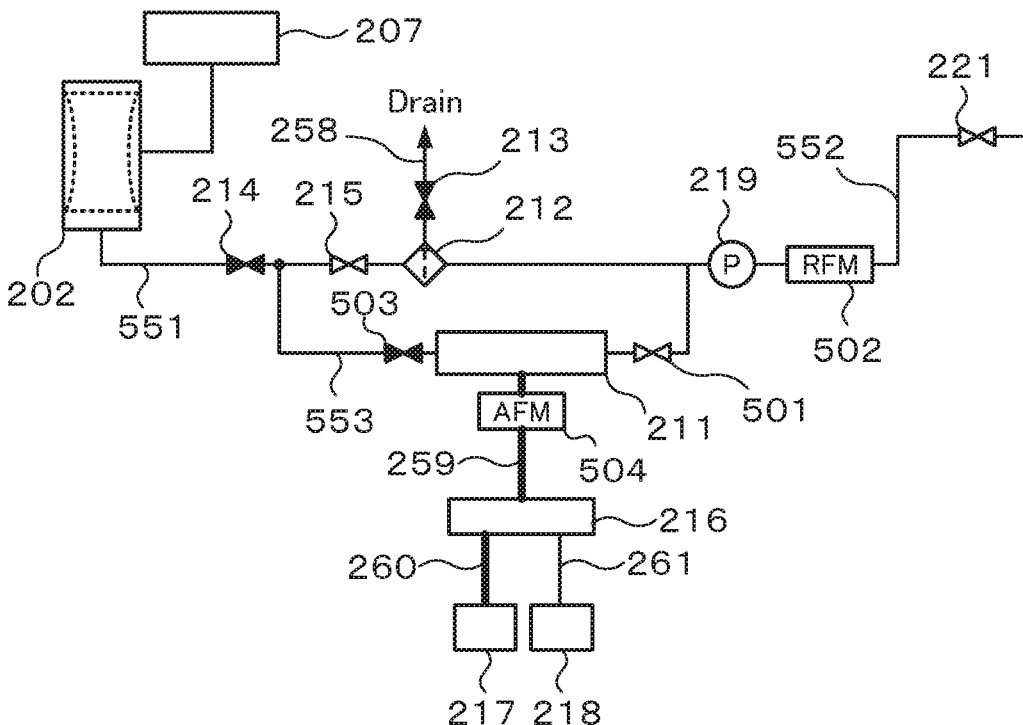
FIG. 21 illustrates the piping system for explaining the outline of the configuration of the resist solution supply apparatus and is an explanatory diagram of another step of replenishing the pump.

Subsequently, as illustrated in FIG. 21, the supply valve 214 is brought into a closed state and the changeover valve 501 is brought into an open state. Then, the pressure in the operating chamber in the pump 211 is controlled by the electropneumatic regulator 216 so that the pressure measured by the pressure sensor 219, namely, the pressure on the changeover valve 501 side of the pump 211 becomes equal to the same target pressure as above.

Thereafter, as illustrated in FIG. 20, the supply control valve 221 is brought into a closed state, the supply valve 214 is brought into an open state, and the replenishment of the resist solution from the buffer tank 202 is started. In this case, the pressure-feeding hydraulic pressure from the buffer tank 202 and the pressure on the changeover valve 501 side of the pump 211 are equal to each other at the above-described target pressure at the time of starting the replenishment, so that the resist solution never momentarily flows into the pump 211 at the time of starting the replenishment.

(Discharge)

Figure 22:
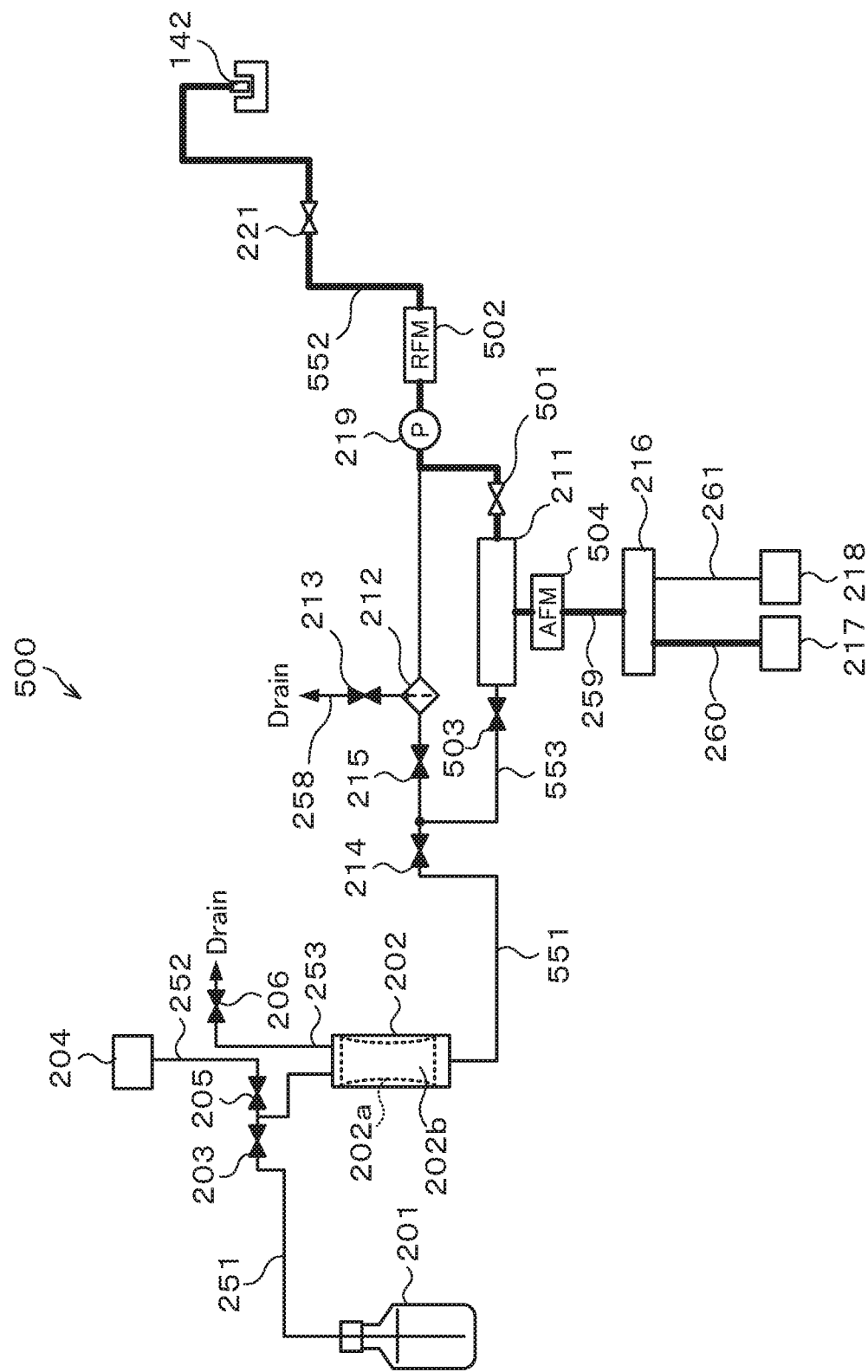
FIG. 22 illustrates the piping system for explaining the outline of the configuration of the resist solution supply apparatus and is an explanatory diagram of a state where a coating step is performed.

At the time of discharging the resist solution, the changeover valve 501 provided in the second treatment solution supply pipe 551 and the supply control valve 221 provided in the third treatment solution supply pipe 552 are brought into an open state as illustrated in FIG. 22. Together with that, the connection destination of the pump 211 is changed over to the pressurization source 217 by the electropneumatic regulator 216 to pressure-feed the resist solution from the port on the changeover valve 501 side of the pump 211 to the third treatment solution supply pipe 552 via the second treatment solution supply pipe 551. This discharges the resist solution passed through the filter 212 and stored in the pump 211 to the wafer via the coating nozzle 142.

(Another Example of Discharge)

Figure 23:
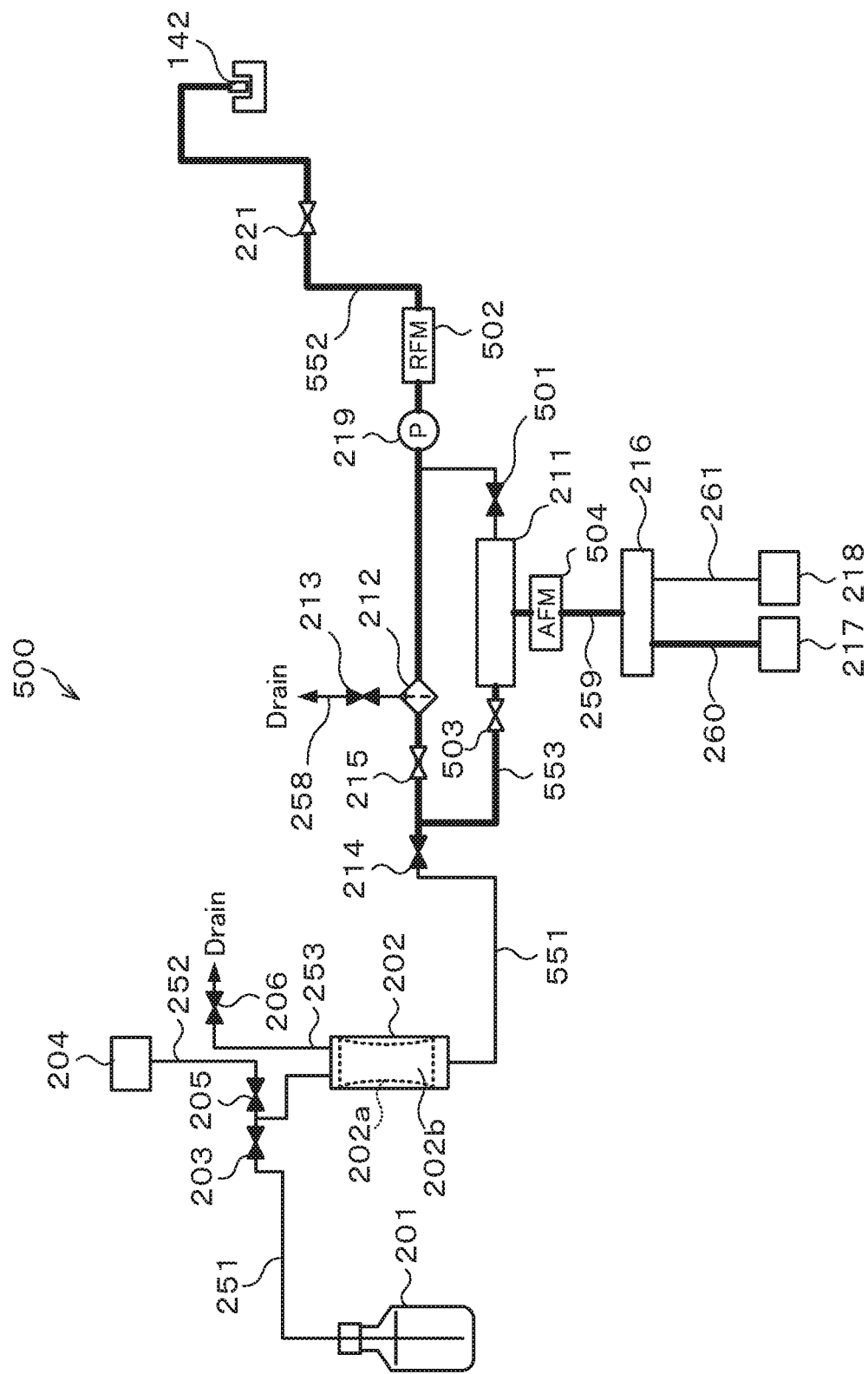
FIG. 23 illustrates the piping system for explaining the outline of the configuration of the resist solution supply apparatus and is an explanatory diagram of a state where another coating step is performed.

As illustrated in FIG. 23, the changeover valve 215 provided in the second treatment solution supply pipe 551, the supply control valve 221 provided in the third treatment solution supply pipe 552, and the changeover valve 503 provided in the return pipe 553 are brought into an open state. Together with that, the connection destination of the pump 211 is changed over to the pressurization source 217 by the electropneumatic regulator 216 to pressure-feed the resist solution from the port on the return pipe 553 side of the pump 211 to the third treatment solution supply pipe 552 via the return pipe 553 and the second treatment solution supply pipe 551. This makes it possible to discharge the resist solution passed through the filter 212 and stored in the pump 211 to the wafer, after being passed again through the filter 212. This configuration can further decrease the possibility of generation of defects on the wafer.

(Changeover of Discharge)

Hereinafter, a mode of discharging the resist solution to the wafer after being passed again through the filter 212 as in FIG. 23 is called a double-pass mode, and a mode of discharging the resist solution to the wafer without being passed again through the filter 212 as in FIG. 22 is called a single-pass mode.

The double-pass mode and the single-pass mode are preferably selectable according to the purpose or the like. For example, the double-pass mode is normally used, and the single-pass mode is used at the time of purge or at the time when the resist solution needs to be discharged in a short time or the like.

Note that both of the replenishment speed of the resist solution to the pump 211, namely, the filtration rate of the filter 202 at the replenishment time and the discharge speed of the resist solution in the double-pass mode, namely, the filtration rate of the filter 202 at the time of discharge in the double-pass mode are preferably low. This is because the particles in the treatment solution can be more surely captured by the filter 212 at the lower rate. However, there is a limit of decreasing the latter filtration rate at the discharge time because the treatment solution is intermittently discharged in a droplet state if the filtration rate is too low. Accordingly, it is preferable that the filtration rate at the filtration rate, of the filtration rate at the replenishment time and the filtration rate at the discharge time, is lower. Note that the filtration rate at the replenishment time is, for example, 0.05 ml/sec, and the filtration rate at the discharge time is, for example, 0.5 ml/sec.

(Vent)

Figure 24:
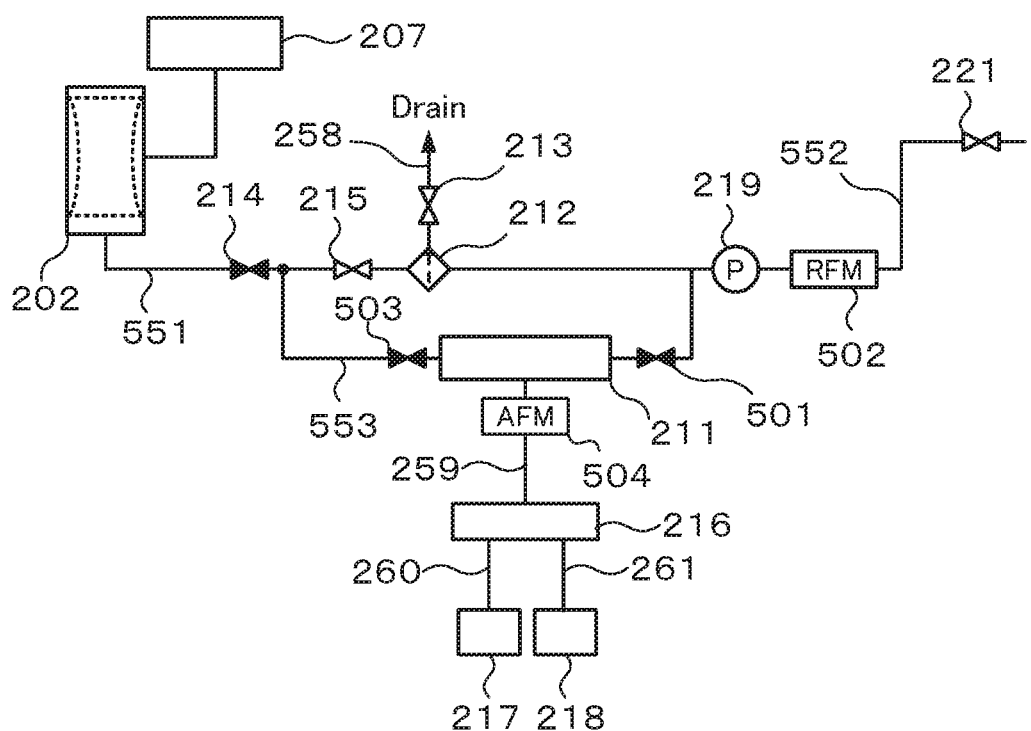
FIG. 24 illustrates the piping system for explaining the outline of the configuration of the resist solution supply apparatus and is an explanatory diagram of a vent step.

At the time of vent, for example, the changeover valve 215 and the supply control valve 221 are brought into an open state first while the supply valve 214 provided in the second treatment solution supply pipe 551 and the changeover valve 503 provided in the return pipe 553 are kept in a closed state, and the drain valve 213 is brought into an open state as illustrated in FIG. 24. Then, the hydraulic pressure in the third treatment solution supply pipe 552 at this time is measured by the pressure sensor 219. The measured hydraulic pressure is almost equal to the back pressure applied to the pump 211 at the time of vent.

Figure 25:
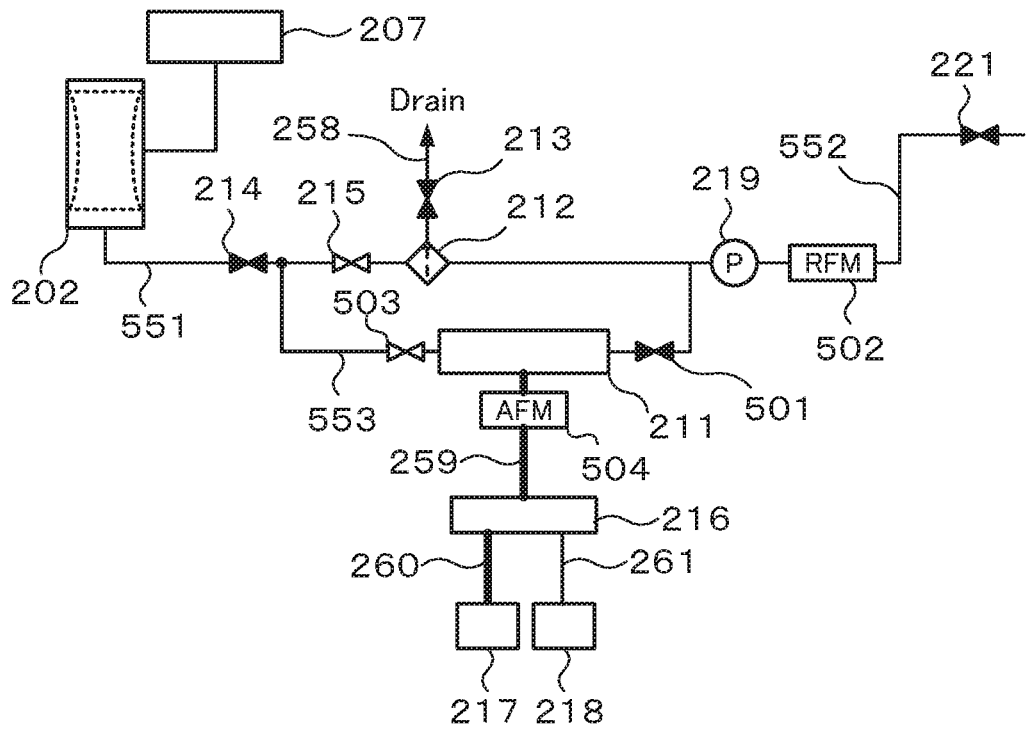
FIG. 25 illustrates the piping system for explaining the outline of the configuration of the resist solution supply apparatus and is an explanatory diagram of the vent step.

Then, as illustrated in FIG. 25, the drain valve 213 and the supply control valve 221 are brought into a closed state, and the changeover valve 503 is brought into an open state. Then, the pressure in the operating chamber in the pump 211 is controlled by the electropneumatic regulator 216 so that the pressure measured by the pressure sensor 219, namely, the pressure on the changeover valve 503 side of the pump 211 becomes equal to the pressure measured by the pressure sensor 219 in the state of FIG. 24.

Figure 26:
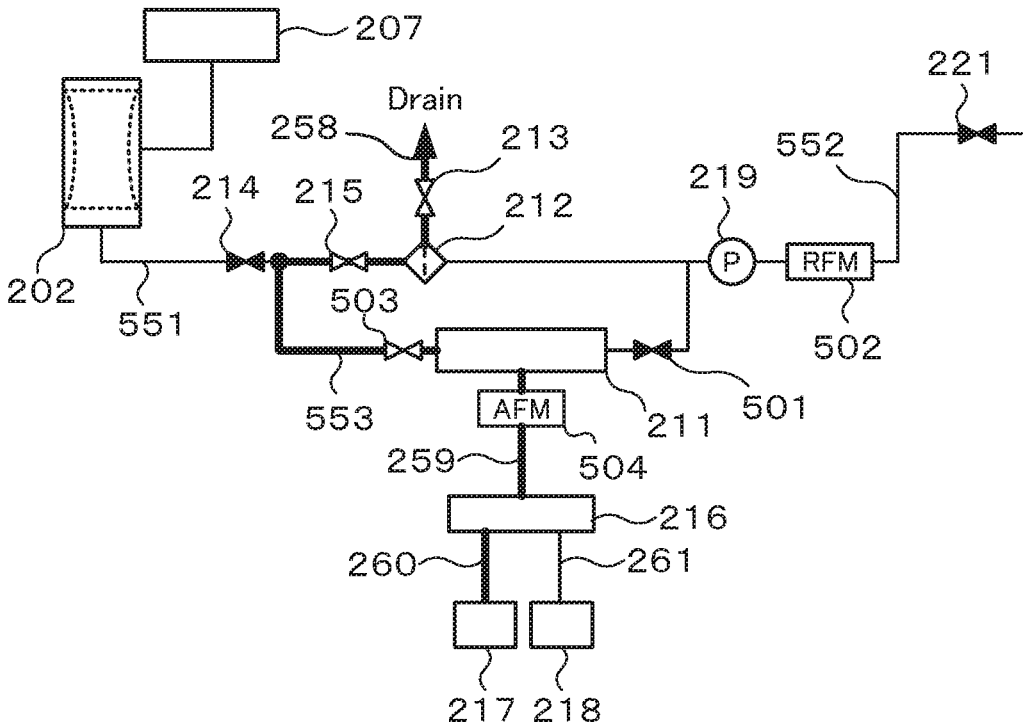
FIG. 26 illustrates the piping system for explaining the outline of the configuration of the resist solution supply apparatus and is an explanatory diagram of the vent step.

Thereafter, as illustrated in FIG. 26, the drain valve 213 is brought into an open state to start drainage of the resist solution in the pump 211 via the drain pipe 258. In this event, the pressure on the changeover valve 503 side of the pump 211 is made equal to the pressure measured by the pressure sensor 219 in the state of FIG. 24, namely, the back pressure applied to the pump 211 at the time of vent, so that the resist solution never momentarily flows into the pump 211 due to fluctuation in back pressure at the time of starting the vent.

(Another Example of Vent)

The modes of vent include a return-vent mode of returning the resist solution to the buffer tank 202 as well as a filter-vent mode of draining the resist solution via the above-described filter 212.

In the return-vent mode, before the vent, for example, the changeover valve 501 and the changeover valve 503 are brought into a closed state and the supply valve 214, the changeover valve 215 and the supply control valve 221 are brought into an open state first as illustrated in FIG. 18. In this state, the resist solution is sent out of the buffer tank 202. Then, the pressure on the secondary side of the filter 212, specifically, the hydraulic pressure in the third treatment solution supply pipe 552 is measured by the pressure sensor 219. Together with the pressure measurement, the pressure in the operating chamber in the buffer tank 202 is controlled by the electropneumatic regulator 207, thereby performing feedback-control so that the pressure measured by the pressure sensor 219 becomes a predetermined pressure. Then, based on the pressure in the operating chamber of the buffer tank 202 at the time when the pressure measured by the pressure sensor 219 becomes the predetermined pressure, the pressure at the time of start of vent of the pump 211 is corrected. For example, when the pressure in the operating chamber at the time when the pressure becomes the predetermined pressure is high, the pressure at the time of start of vent of the pump 211 is corrected to be high, whereas when the pressure in the operating chamber is low, the pressure at the time of start of vent is corrected to be low.

Then, as illustrated in FIG. 25, the supply valve 214 and the supply control valve 221 are brought into a closed state and the changeover valve 503 is brought into an open state. Then, the pressure in the operating chamber in the pump 211 is controlled by the electropneumatic regulator 216 so that the pressure measured by the pressure sensor 219, namely, the pressure on the changeover valve 503 side of the pump 211 becomes the corrected pressure at the time of start of vent of the pump 211.

Figure 27:
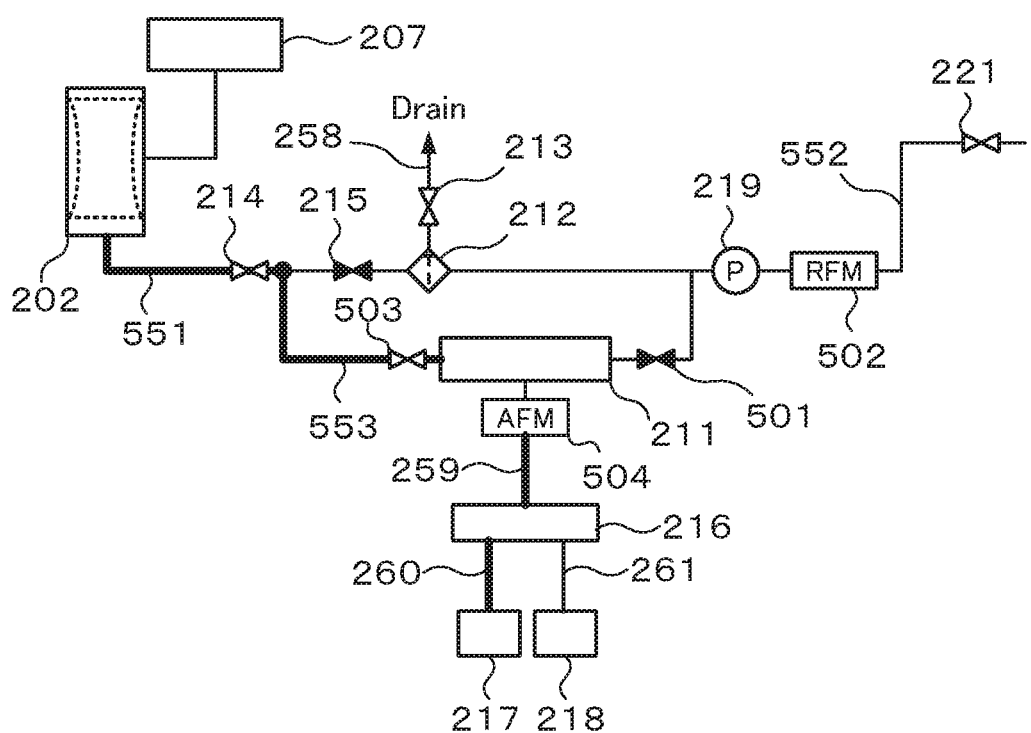
FIG. 27 illustrates the piping system for explaining the outline of the configuration of the resist solution supply apparatus and is an explanatory diagram of another vent step.

Thereafter, as illustrated in FIG. 27, the supply valve 214 is brought into an open state, and the changeover valve 215 is brought into a closed state, and returning of the resist solution in the pump 211 to the buffer tank 202, namely, return vent is started.

The pressure in the storage chamber of the buffer tank 202 fluctuates depending on the amount of the resist solution in the storage chamber, so that if the pressure of the pump 211 at the time of start of return vent is set constant, return vent cannot be appropriately performed. However, the pressure of the pump 211 at the time of start of return vent is corrected based on the pressure in the operating chamber of the buffer tank 202 corresponding to the pressure in the storage chamber of the buffer tank 202 in this example, so that return vent can be appropriately performed.

(Vent Amount)

The vent amount is decided by the difference between the replenishment amount to the pump 211 and the discharge amount of the resist solution.

In the example of the drawing, the liquid flow meter 502 is provided, and therefore the actual discharge amount of the resist solution can be calculated based on the measured result by the liquid flow meter 502. Accordingly, the vent amount can be accurately calculated.

In the case where the liquid flow meter 502 is not provided, the flow rate of gas sent to the pump 211 is measured by the gas flow meter 504 provided for the pump 211, and the vent amount is calculated using the measured result. The gas flow meter 504 is a mass flow meter, and by converting the integrated value of the measured mass to volume, the discharge amount of the resist solution can be calculated. Since the relation between mass and volume depends on pressure and temperature, the conversion from mass to volume may be performed assuming that the temperature in the pump 211 is 20° C. and the pressure in the pump 211 is 1 atm, or may be performed based on the pressure in the operating chamber of the pump 211 measured at a temperature in the pump 211 of 23° C.

By accurately deciding the vent amount, the time of vent can be appropriately set.

(Execution Timing of Vent)

The return vent is performed to prevent retention of the resist solution, and is performed periodically for instance.

The filter vent is performed when the cleaning degree of the resist solution in the pump 211 or the like is low, and performed, for example, at start-up time, periodically, or when bubbles are detected on the primary side of the filter 212.

A detector for the bubbles is preferably provided between a connection portion of the return pipe 553 and the supply valve 214 in the second treatment solution supply pipe 551. This portion is located above in the vertical direction of the filter 212 and the pump 211 in the actual resist solution supply apparatus 500. Therefore, the bubbles generated on the primary side of the filter, more specifically, bubbles generated in the filter 212, the pump 211, and a route from the portion where the bubble detector is provided to the filter 212 and the pump 211 can be surely detected.

(Abnormality Detection)

Since the diaphragm constituting the storage chamber of the pump 211 expands with time in the resist solution supply apparatus 500, the pressure for deforming the diaphragm, namely, the pressure (EV pressure) in the operating chamber in the pump 211 controlled by the electropneumatic regulator 216 needs to be made larger according to the expansion of the diaphragm.

Hence, in the resist solution supply apparatus 500, the EV pressure is measured and compared with the pressure (hydraulic pressure) measured by the pressure sensor 219. When the difference between the EV pressure and the hydraulic pressure becomes a predetermined value or more because the expansion of the diaphragm exceeds an allowable range or another abnormality occurs, an error is notified by sound information, visual information or the like.

Further, together with the error notification, the pressurization in the operating chamber of the pump 211 by the pressurization source 217 is stopped to make the EV pressure to atmospheric pressure. In this event, the supply valve 214, the changeover valve 215, and the changeover valve 501 are preferably brought into an open state.

An error may be detected based on the pressure in the operating chamber in the buffer tank also for the buffer tank 202 as with the pump 211.

Note that the liquid flow meter 502 is provided between the pump 211 and the supply control valve 221 in the third treatment solution supply pipe 552 in the above resist solution supply apparatus 500, but may be provided between the connection portion of the third treatment solution supply pipe 552 and the filter 212 in the second treatment solution supply pipe 551. Alternatively, the liquid flow meter 502 does not have to be provided.

In the resist solution supply apparatus 500, the pressure sensor 219 that measures the pressure on the secondary side of the filter 212 is provided at a most upstream side portion of the third treatment solution supply pipe 552. However, the pressure sensor 219 may be provided between the connection portion of the third treatment solution supply pipe 552 and the changeover valve 501 in the second treatment solution supply pipe 551. In this case, the resist does not pass through the pressure sensor 219 when discharged from the pump 211 via the filter 212, so that mixture of particles into the resist solution can be prevented more surely.

In the resist solution supply apparatus 500, a pressure sensor that measures the pressure on the primary side of the filter 212 may be provided in addition to the pressure sensor 219 that measures the pressure on the secondary side of the filter 212.

The pressure sensor on the primary side is provided, for example, at a portion between the changeover valve 215 and the filter 212 in the second treatment solution supply pipe 551. The differential pressure between the pressure sensor on the primary side provided on the portion and the pressure sensor 219 on the secondary side varies depending on the state of clogging of the filter 212. Accordingly, provision of the pressure sensor 219 on the primary side at the above-described portion makes it possible to determine the state of the filter 212 based on the differential pressure.

Further, when the pressure sensor on the primary side is provided at the above-described portion, the pressure loss from the buffer tank 202 to the pressure sensor on the primary side is smaller than the pressure loss from the buffer tank 202 to the pressure sensor 219 on the secondary side. Accordingly, feedback of the measured result by the pressure sensor on the primary side to the pressure in the operating chamber of the buffer tank 202 makes it possible to make the magnitude of the pressurization to the resist solution in the buffer tank 202 to a desired one as compared with the case of feedback of the measured result by the pressure sensor 219 on the secondary side.

Note that also when the pressure sensor on the primary side is provided at a portion between the buffer tank 202 and the supply valve 214 in the second treatment solution supply pipe 551 in the resist solution supply apparatus 500, the same effects as those when the pressure sensor on the primary side is provided at the portion between the change-over valve 215 and the filter 212 as described above can be obtained.

The resist solution supply apparatus 500 can generate a deaerated solution by the buffer tank 202. Passing the deaerated solution produced in the buffer tank 202 through the filter 212 at the start-up time or the periodic maintenance time of the filter 212 makes it possible to remove microbubbles that cannot be removed from an undeaerated ordinary resist solution. Note that the deaerated solution passed through the filter 212 is preferably drained via the drain pipe 258.

Though the resist solution is explained as an example of the treatment solution to be supplied by the treatment solution supply apparatus according to the present invention in the above, for example, a coating solution for SOG (Spin On Glass) may be supplied.

EXAMPLES

FIG. 28A to FIG. 28D are charts illustrating the amounts of particles observed in resist films in examples and comparative examples, and FIG. 28A to FIG. 28D illustrate the amounts of particles in Comparative Example 1, Example 1, Comparative Example 2, and Example 2 in order. Further, in the drawing, the horizontal axis indicates the number of the wafer, and the longitudinal axis indicates the amount of particles that is a value when the number of particles existing in the resist film of the fourth wafer in Comparative Example 2 is 1. The presence or absence of particles/number was confirmed by observation under an electron microscope. Note that a shaded area in a bar graph in the drawing indicates the number of particles which seem to be caused by bubbles.

In Example 1 and Example 2, the pump 211 was replenished with the resist solution from the buffer tank 202 while pressurization was being performed in the buffer tank 202 so that the pressure at the pressure sensor 219 became 50 kPa using the resist solution supply apparatus 500 according to the fourth embodiment, more specifically, while the pressure in the operating chamber of the buffer tank 202 was being controlled so that the pressure at the pressure sensor 219 became 50 kPa. Further, in Example 1 and Example 2, the resist solution was supplied from the pump 211 in the double-pass mode to form a resist film.

In Comparative Example 1 and Comparative Example 2, the pump 211 was replenished with the resist solution from the buffer tank 202 and the resist solution was supplied from the pump 211 in the double-pass mode to form a resist film using the resist solution supply apparatus 500 according to the fourth embodiment, but pressurization by the buffer tank 202 was not performed at the replenishment time.

Besides, Example 1 and Comparative Example 1 are different from Example 2 and Comparative Example 2 in positional relation between the buffer tank and the filter, piping between them, place where the treatment solution supply apparatus is installed and so on.

Figure 28A:
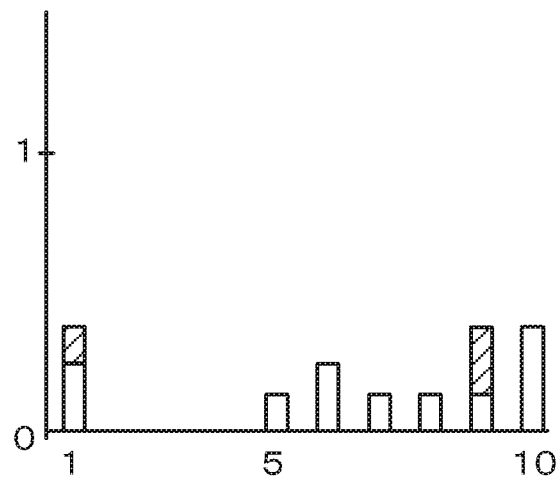
FIG. 28A to FIG. 28D are charts illustrating the amounts of particles observed in resist films in examples and comparative examples.
Figure 28B:
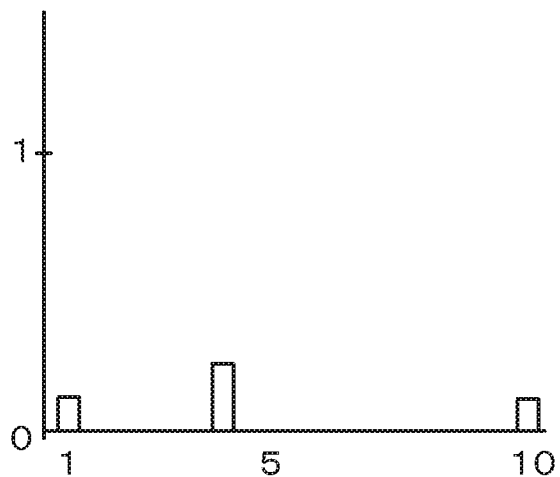
Figure 28C:
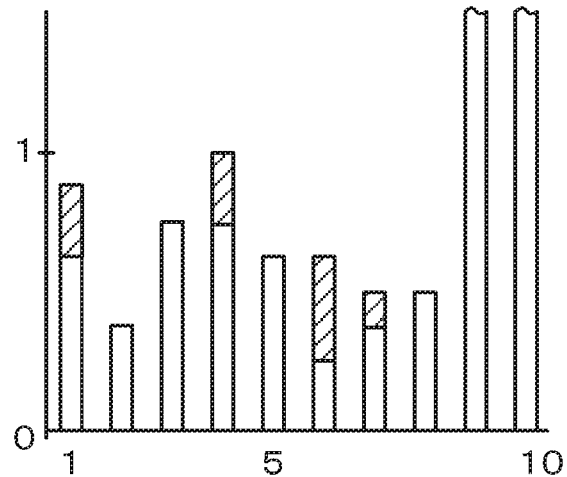

As illustrated in FIG. 28A and FIG. 28C, many particles exist and particles that seem to be caused by bubbles exist in Comparative Example 1 and Comparative Example 2 though slightly less in Comparative Example 1.

Figure 28D:
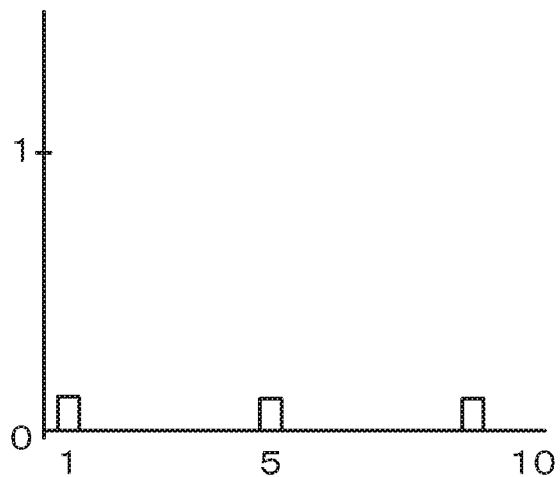

In contrast, as illustrated in FIG. 28B and FIG. 28D, the number of particles is small in Example 1 and Example 2 and, in particular, the number of particles that seem to be caused by bubbles is zero.

As is found from the above examples and comparative examples, according to the resist solution supply apparatus 500, even in an environment in which many particles exist without the pressurizing function of the buffer tank 202, the particles can be appropriately removed by the filter 212. In short, the particles can be appropriately removed regardless of the environment. Further, according to the resist solution supply apparatus 500, generation of particles caused by bubbles can be prevented regardless of the environment.

The present invention is useful for a technique of applying a treatment solution to a treatment body.

What is claimed is:

1. A treatment solution supply apparatus for supplying a treatment solution to a treatment solution discharge unit that discharges the treatment solution to a treatment body, the treatment solution supply apparatus comprising:
    a temporary storage apparatus that has a storage chamber temporarily storing the treatment solution supplied from a treatment solution supply source that stores the treatment solution;
    a filter in downstream fluid communication from the temporary storage apparatus, wherein the filter removes a foreign substance in the treatment solution flowing from the temporary storage apparatus;
    a pump in downstream fluid communication from the filter, wherein the pump sends the treatment solution from which the foreign substance has been removed by the filter to the treatment solution discharge unit; and
    a controller,
    wherein the temporary storage apparatus has a diaphragm capable of being deformed to change a capacity inside the storage chamber; and
    wherein the controller is configured to cause the capacity of the storage chamber to change to control pressure-feeding of the treatment solution stored in the storage chamber to the filter so that a hydraulic pressure in the filter becomes a desired pressure.

2. The treatment solution supply apparatus according to claim 1, further comprising:
    a pressure measuring apparatus that is provided on a downstream side of the temporary storage apparatus and measures a hydraulic pressure of the treatment solution;
    wherein the controller is further configured to control at least the pressure-feeding of the treatment solution from the temporary storage apparatus, based on a measured result by the pressure measuring apparatus.

3. The treatment solution supply apparatus according to claim 2,
wherein the pressure measuring apparatus measures a hydraulic pressure on a secondary side of the filter, and
wherein the controller controls a hydraulic pressure at time of the pressure-feeding so that the hydraulic pressure on the secondary side of the filter becomes constant.

4. The treatment solution supply apparatus according to claim 2,
wherein the pressure measuring apparatus measures a hydraulic pressure on a secondary side of the filter, and
wherein the controller makes the temporary storage apparatus pressure-feed the treatment solution by applying a predetermined pressure to the temporary storage apparatus when the hydraulic pressure on the secondary side of the filter falls within a predetermined range.

5. The treatment solution supply apparatus according to claim 2,
wherein the pressure measuring apparatus measures a hydraulic pressure on a primary side of the filter, and
wherein the controller controls a hydraulic pressure at time of the pressure-feeding so that the hydraulic pressure on the primary side of the filter becomes constant.

6. The treatment solution supply apparatus according to claim 2, further comprising:
a plurality of sets of the temporary storage apparatus, the filter, and the pump,
wherein the controller comprises an electropneumatic regulator that is provided for each of the temporary storage apparatuses and adjusts a hydraulic pressure in a storage chamber that stores the treatment solution of the temporary storage apparatus.

7. The treatment solution supply apparatus according to claim 2, further comprising:
a treatment solution supply pipe that is provided with the temporary storage apparatus, the filter, and the pump in order from an upstream side,
wherein the pump comprises a storage chamber that stores the treatment solution,
wherein the treatment solution supply pipe comprises a first valve between the temporary storage apparatus and the filter, and a second valve between the temporary storage apparatus and the filter, and
wherein the controller is further configured to, at time of replenishing the storage chamber of the pump with the treatment solution from the temporary storage apparatus from which the foreign substance has been removed by the filter, control a pressure of the treatment solution from the temporary storage apparatus so that a pressure on a secondary side of the filter measured by the pressure measuring apparatus becomes a predetermined value in a state where the first valve is opened and the second valve is closed, then control a pressure in the storage chamber so that the pressure on the secondary side of the filter measured by the pressure measuring apparatus becomes the predetermined value in a state where the first valve is closed and the second valve is opened, and then start the replenishment in a state where the first valve and the second valve are opened.

8. The treatment solution supply apparatus according to claim 1,
wherein the temporary storage apparatus is a tubephragm pump.

9. The treatment solution supply apparatus according to claim 1, further comprising:
a plurality of sets of the temporary storage apparatus, the filter, and the pump,
wherein each of the temporary storage apparatuses comprises, as separate bodies, a storage apparatus that stores the treatment solution and another pump that pressure-feeds the treatment solution in the storage apparatus,
wherein a common electropneumatic regulator that adjusts a hydraulic pressure in a storage chamber that stores the treatment solution for the another pump is provided for the another pump of the temporary storage apparatus, and
wherein control of a hydraulic pressure at time of pressure-feeding the treatment solution from the temporary storage apparatus is performed by the electropneumatic regulator.

10. The treatment solution supply apparatus according to claim 9,
wherein the another pump is a tubephragm pump.

11. The treatment solution supply apparatus according to claim 1,
wherein the pump is connected with a return pipe connected to the filter; and
wherein when the pump sends the treatment solution from which the foreign substance has been removed by the filter to the treatment solution discharge unit, the pump sends the treatment solution through the return pipe such that the treatment solution passes again through the filter.

* * * * *